US010165673B2

(12) United States Patent
Tsukuda

(10) Patent No.: US 10,165,673 B2
(45) Date of Patent: Dec. 25, 2018

(54) ELECTRONIC DEVICE

(71) Applicant: Renesas Electronics Corporation, Koutou-ku, Tokyo (JP)

(72) Inventor: Tatsuaki Tsukuda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/870,837

(22) Filed: Jan. 12, 2018

(65) Prior Publication Data
US 2018/0263108 A1 Sep. 13, 2018

(30) Foreign Application Priority Data

Mar. 10, 2017 (JP) .................................. 2017-046038

(51) Int. Cl.
H05K 1/02 (2006.01)
H03H 7/01 (2006.01)
H05K 1/11 (2006.01)
H05K 1/18 (2006.01)

(52) U.S. Cl.
CPC ......... *H05K 1/0216* (2013.01); *H03H 7/0138* (2013.01); *H05K 1/116* (2013.01); *H05K 1/181* (2013.01); *H05K 1/023* (2013.01); *H05K 1/0218* (2013.01); *H05K 1/0298* (2013.01); *H05K 2201/0723* (2013.01); *H05K 2201/093* (2013.01); *H05K 2201/09218* (2013.01); *H05K 2201/1003* (2013.01); *H05K 2201/10015* (2013.01); *H05K 2201/10022* (2013.01);

(Continued)

(58) Field of Classification Search
USPC ......................................... 361/772, 760, 773
See application file for complete search history.

(56) References Cited

U.S. PATENT DOCUMENTS

2007/0194433 A1 8/2007 Suwa et al.
2011/0175213 A1* 7/2011 Mori ........................ H01L 23/13
257/675
2012/0075038 A1 3/2012 Kaizaki
(Continued)

FOREIGN PATENT DOCUMENTS

JP 2005-183790 A 7/2005
JP 2005-294528 A 10/2005
JP 2009-021747 A 1/2009

OTHER PUBLICATIONS

Office Action, dated Aug. 10, 2018, in European Patent Application No. 18160007.3.

Primary Examiner — Andargie M Aychillhum
(74) Attorney, Agent, or Firm — Shapiro, Gabor and Rosenberger, PLLC

(57) ABSTRACT

A wiring board of an electronic device includes: a board terminal connected to a semiconductor device (semiconductor component); a wire formed in a first wiring layer and electrically connected to the board terminal; a conductor pattern formed in a second wiring layer and electrically connected to the wire via a via wire; and another conductor pattern formed in a third wiring layer and supplied with a first fixed potential. The conductor pattern and the another conductor pattern face each other with an insulating layer interposed therebetween, and an area of a region where the conductor pattern and the another conductor pattern face each other is larger than an area of the wire.

20 Claims, 22 Drawing Sheets

(52) U.S. Cl.
CPC .............. *H05K 2201/10151* (2013.01); *H05K 2201/10689* (2013.01)

(56) References Cited

U.S. PATENT DOCUMENTS

2012/0222891 A1   9/2012   Ishida
2015/0237731 A1   8/2015   Toyama et al.

* cited by examiner

ELECTRONIC DEVICE

CROSS-REFERENCE TO RELATED APPLICATION

The present application claims priority from Japanese Patent Application No. 2017-046038 filed on Mar. 10, 2017, the content of which is hereby incorporated by reference into this application.

TECHNICAL FIELD OF THE INVENTION

The present invention relates to an electronic device (semiconductor module), and relates to a technique effective when applied to an electronic device in which a semiconductor component is mounted on a wiring board, for example.

BACKGROUND OF THE INVENTION

Japanese Patent Application Laid-Open Publication No. 2005-183790 (Patent Document 1) and Japanese Patent Application Laid-Open Publication No. 2005-294528 (Patent Document 2) describe that a ground pattern and a wiring pattern are stacked with an insulating layer interposed therebetween, and high frequency noise is reduced by a layout of the ground pattern. Also, Japanese Patent Application Laid-Open Publication No. 2009-21747 (Patent Document 3) describes such a configuration that a bandpass filter provided with an impedance matching circuit includes a plurality of open stubs connected to a coplanar line, and a capacitor provided on an input-end side.

SUMMARY OF THE INVENTION

A semiconductor device is used for various purposes, and from a viewpoint of allowing a semiconductor device to stably operate, a technique of reducing noise which affects an operation of a semiconductor device is required. One possible method of reducing noise which affects an operation of a semiconductor device is to mount an anti-noise component such as a condenser on a wiring board on which the semiconductor device is mounted. However, it has become clear that there is leeway for improving the foregoing method from a viewpoint of efficiently reducing noise.

Other objects and novel features of the present invention will be apparent from the description of the present specification and the accompanying drawings.

A wiring board of an electronic device according to one embodiment includes: a first board terminal connected to a semiconductor component; a first wire formed in a first wiring layer and electrically connected to the first board terminal; a first conductor pattern formed in a second wiring layer different from the first wiring layer and electrically connected to the first wire via a first via wire; and a second conductor pattern formed in a third wiring layer different from the first wiring layer and the second wiring layer and supplied with a first fixed potential. The first conductor pattern and the second conductor pattern face each other with an insulating layer interposed therebetween, and an area of a region where the first conductor pattern and the second conductor pattern face each other is larger than an area of the first wire.

According to the one embodiment, performance of the electronic device can be improved.

BRIEF DESCRIPTIONS OF THE DRAWINGS

DESCRIPTIONS OF THE PREFERRED EMBODIMENTS

Figure 1:
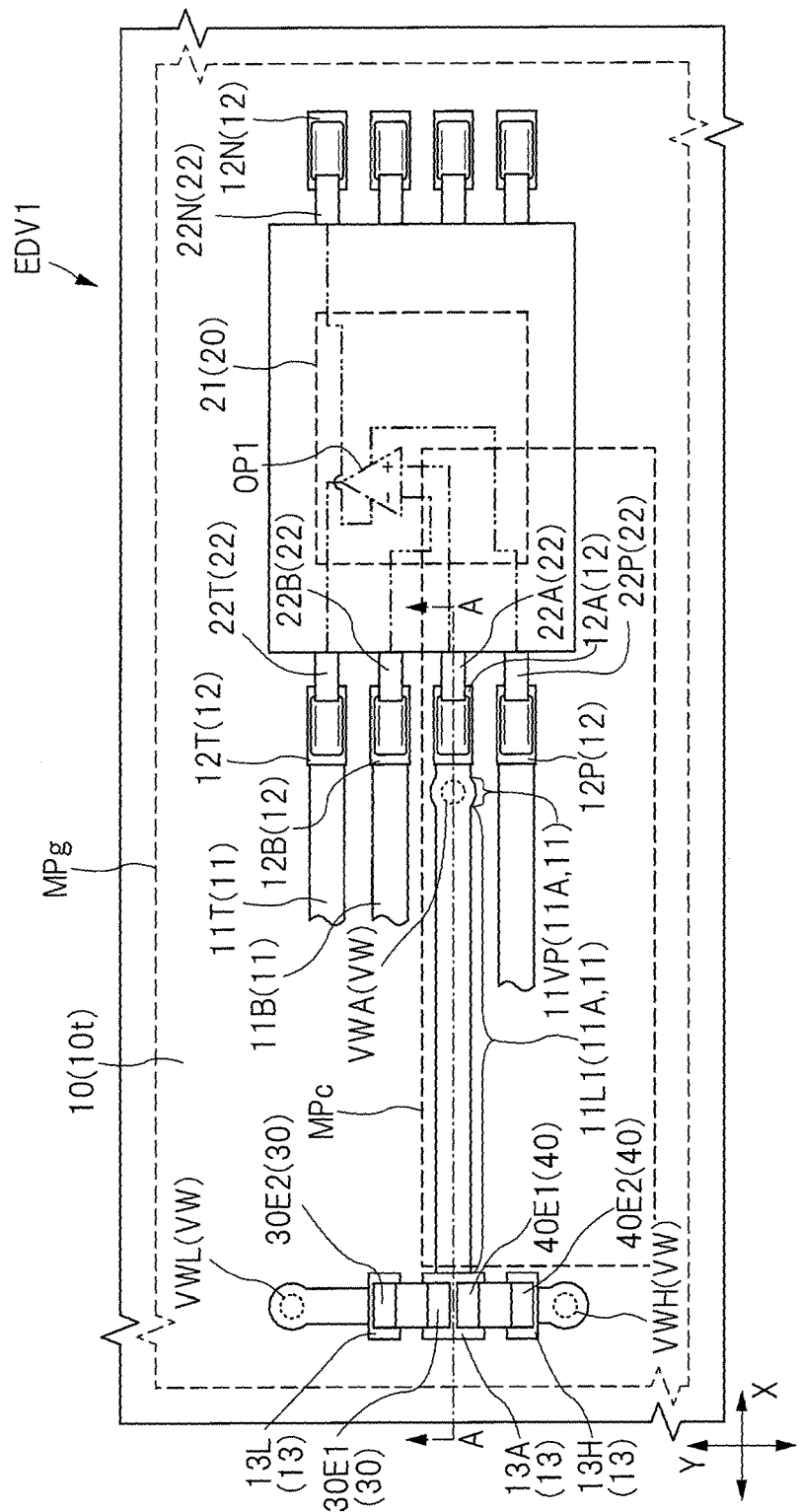
FIG. 1 is an enlarged plan view showing an example of a configuration of an electronic device according to one embodiment.

Explanation of Description Form, Basic Terms and Method in Present Application

In this application, the embodiment will be described in a plurality of sections or the like when required as a matter of convenience. However, these sections are not independent or distinct from each other unless particularly explicitly described otherwise, and they are individual parts of a single example, one of them is a partial detail of the other, or one of them is a modification example or the like of part or the whole of the other, irrespective of the order of descriptions. Also, the description of the same portions is not repeated in principle. Further, each component in the embodiment is not indispensable unless particularly explicitly described otherwise, unless the component is logically limited to a specific number, and unless it is obvious from the context that the component is indispensable.

Similarly, in the description of an embodiment and others, even when "X made up of A" or the like is referred to with respect to a material, a composition, and the like, X containing elements other than A is not excluded unless particularly explicitly described otherwise and unless it is obvious from the context that X does not contain elements other than A. For example, when referring to an ingredient, it means "X containing A as a main ingredient" or the like. For example, even when "silicon member" or the like is mentioned, the meaning is not limited to pure silicon, and it is needless to say that a member containing a SiGe (silicon-germanium) alloy, another multi-element alloy containing silicon as a main ingredient, another additive, or the like is also included. In addition, even when a gold plating, a Cu layer, a nickel plating and others are mentioned, not only a pure one but also a member containing each of gold, Cu and nickel as a main ingredient is included unless particularly explicitly described otherwise.

Further, even when a specific value or amount is mentioned, a value larger than a specific value or smaller than the specific value is also applicable unless particularly explicitly described otherwise, unless it is logically limited to the specific value, and unless it is obvious from the context that a value is not larger than the specific value or smaller than the specific value.

Also, the same or similar portions are denoted by the same or similar reference signs or characters throughout the drawings for describing the embodiment, and the repetitive description thereof is omitted.

In addition, in the accompanying drawings, hatching may be omitted even in a cross section in the case where the drawings become rather complicated or distinction from a clearance is apparent. In association with this, when it is obvious from the description or the like, a contour line in a background may be omitted even in a case of a planarly closed hole. In addition, in order to specify the fact that a portion is not a clearance or specify a boundary of regions, hatching or dot pattern may be given even in the case other than the cross section.

Noise Countermeasure

Along with a reduced size and higher functionality of a semiconductor device (semiconductor component), a semiconductor device is incorporated in various electronic devices (equipment) and is used as a component for control. For example, taking a motor vehicle or a two-wheeled vehicle with an engine as an example, a semiconductor device is used for various types of components for control such as drive control of a power system such as an engine or a motor, operation control of various components which transmit power to a tire, control of an optical component such as a light or a blinker, or control of a sensor which monitors an operation state of each component.

The above-described control system using a semiconductor device is configured by mounting a plurality of electronic components including a semiconductor device on a board and electrically connecting to each other. In this case, it is important to take a noise countermeasure for electronic devices such that respective electronic components mounted on a board do not interfere with operation of one another.

A noise countermeasure for an electronic device can be broadly divided into the following two categories. One category includes a countermeasure of reducing a degree to which an electromagnetic wave generated from a circuit around a target electronic component or generated externally from the electronic device affects an operation of the target electronic component (Electro Magnetic Susceptibility (EMS)). This EMS countermeasure can be restated as a countermeasure of improving noise resistance of a target electronic component. The other category includes a countermeasure of reducing a degree to which an operation of a target electronic component interferes with (disturbs) an operation of other circuits (Electro Magnetic Interference (EMI)). This EMI countermeasure can be restated as a countermeasure of reducing noise influence which is caused by the target electronic component.

In the following embodiments, modes in which a filter circuit filtering noise is formed in a wiring board on which electronic components are mounted will be in order for the purpose of taking the EMS countermeasure or the EMI countermeasure, by providing a plurality of specific examples.

First Embodiment

In a first embodiment, a mode in which a low-pass filter which filters noise of an output signal from a sensor is connected in a transmission path which electrically connects an electronic component including the sensor (sensor component) and a semiconductor component including an amplifier circuit which amplifies an output signal from the sensor will be described as an example of the EMS countermeasure. Note that, in the following description, a mode in which a thermistor which measures a change in temperature is used as a sensor will be exemplified. However, as an electronic component such as a sensor component which transmits an input signal to an amplifier circuit or the like, a wide variety of electronic components other than the thermistor are available.

Figure 2:
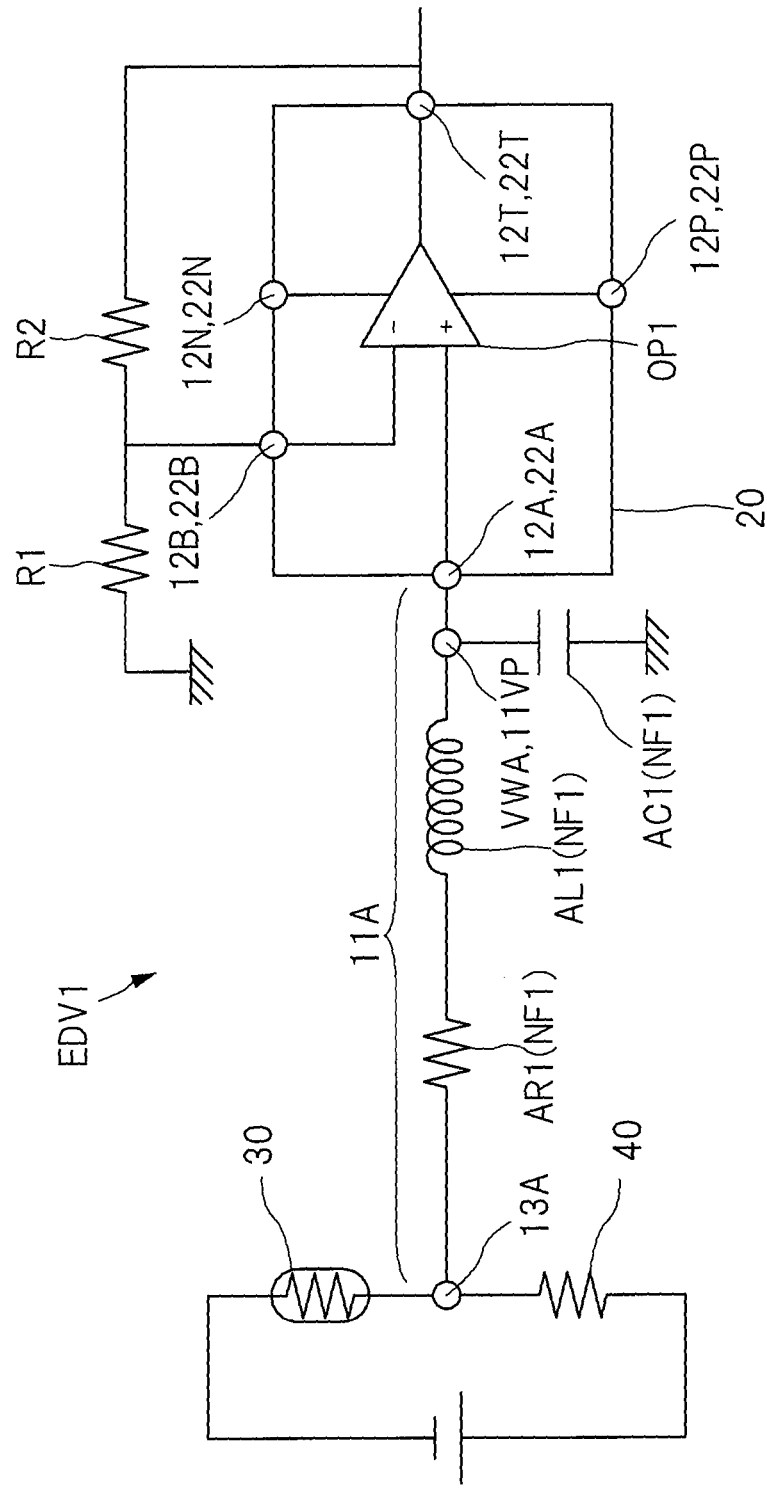
FIG. 2 is a diagram of an equivalent circuit of a path electrically connecting a sensor and an amplifier circuit shown in FIG. 1.
Figure 3:
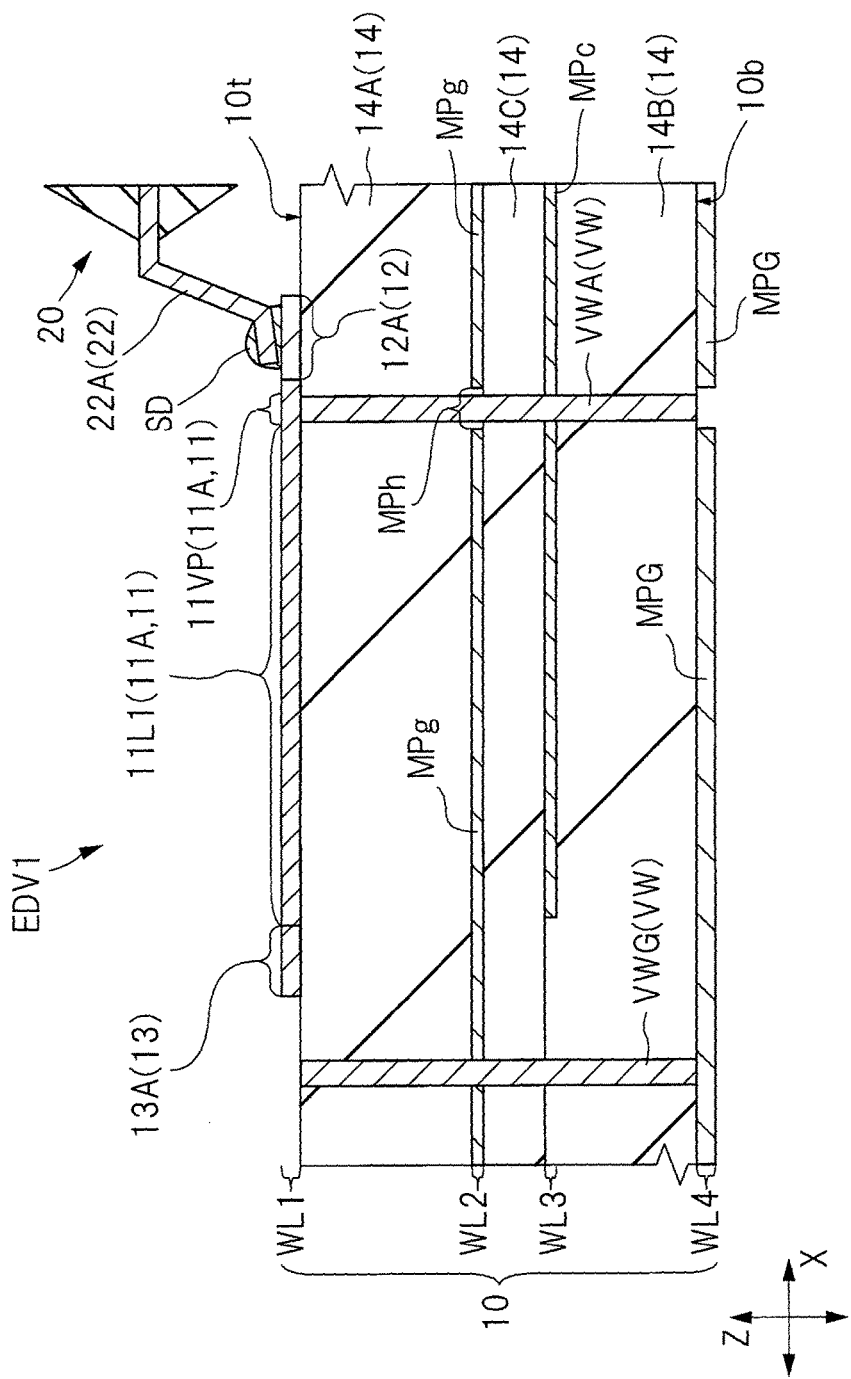
FIG. 3 is an enlarged cross-sectional view taken along a line A-A shown in FIG. 1.

FIG. 1 is an enlarged plan view showing an example of a configuration of an electronic device according to one embodiment. FIG. 2 is a diagram of an equivalent circuit of the electronic device shown in FIG. 1. FIG. 3 is an enlarged cross-sectional view taken along a line A-A shown in FIG. 1.

In FIG. 1, each of a conductor pattern MPc, a conductor pattern MPg, and a via wire VW serving as an interlayer conducting path, which are formed in a wiring layer different from a wiring layer where a wire 11 is formed, are shown by a dashed line. Likewise, in FIG. 1, a semiconductor chip 21 incorporated in a semiconductor device 20 is shown by a dashed line. Also, in FIG. 1, while a part of wires connected to a plurality of board terminals 12 are shown, the other part is omitted. Also, in FIG. 1, a circuit diagram of an amplifier circuit OP1 included in the semiconductor device 20 is schematically shown by a two-dot chain line. Also, FIG. 2 shows an example of a non-inverting amplifier circuit which is simplified, by way of example of an amplifier circuit. However, an amplifier circuit has various modification examples such as an inverting amplifier circuit and a differential amplifier circuit.

As shown in FIG. 1, an electronic device EDV1 according to the present embodiment is a structural unit in which a plurality of components (electronic components) such as the semiconductor device 20, a sensor 30, and a resistor component 40 are mounted on a wiring board 10 which is a base material, and respective components are electrically connected to each other via a conductive member such as the wire 11. The electronic device EDV1 includes the semiconductor device (semiconductor component, electronic component) 20, the sensor (electronic component) 30, and the resistor component (electronic component) 40, which are mounted on an upper surface 10t of the wiring board 10.

In the present embodiment, the sensor 30 is a temperature sensor (thermistor), for example, and is an electronic component including a sensor element having an electric resistance value which varies in accordance with the ambient temperature. Also, the semiconductor device 20 is an electronic component including the amplifier circuit (operation amplifier) OP1 which receives a signal (temperature detection signal) output from the sensor 30 and amplifies the signal. The amplifier circuit OP1 is an integrated circuit formed in the semiconductor chip 21 included in the semiconductor device 20. Also, each of the sensor 30 and the resistor component 40 is a chip component including two electrodes which are located opposite to each other. The sensor 30 includes an electrode 30E1 and an electrode 30E2 located opposite to each other. The resistor component 40 includes an electrode 40E1 and an electrode 40E2 located opposite to each other.

Also, the semiconductor device 20 includes a plurality of terminals 22 which are external terminals. The plurality of terminals (leads) 22 include a terminal 22A to which a signal output from the sensor 30 is input. The terminal 22A is connected to a non-inverting input terminal of the amplifier circuit OP1. Also, the plurality of terminals 22 include a terminal 22B connected to an inverting input terminal of the amplifier circuit OP1. Also, the plurality of terminals 22 include a terminal 22T connected to an output terminal of the amplifier circuit OP1. Also, the plurality of terminals 22 include a terminal 22P forming a transmission path which supplies a high-side potential (positive potential, for example) to the amplifier circuit OP1. Also, the plurality of terminals 22 include a terminal 22N forming a transmission path which supplies a low-side potential (negative potential or ground potential, for example) which is lower than the high-side potential, to the amplifier circuit OP1.

The semiconductor device 20 is mounted on the upper surface 10t of the wiring board 10. The plurality of terminals 22 of the semiconductor device 20 and the plurality of board terminals 12 of the wiring board 10 are electrically connected, respectively.

The wiring board 10 has the upper surface (surface, main surface, front surface) 10t and a lower surface (surface, main surface, back surface) 10b (see FIG. 3) located opposite to the upper surface 10t. Note that, although FIG. 1 and FIG. 3 show a mode in which the plurality of wires 11 and the plurality of board terminals 12 and 13 are formed on the upper surface 10t of the wiring board 10 and those conductor patterns are exposed, an insulating film (protective film, solder resist film) with which the conductor patterns such as the plurality of wires 11 are covered may be formed over the upper surface 10t. In this case, an opening is formed in the insulating film with which the upper surface 10t is covered, and a part or a whole of each of the plurality of board terminals 12 and 13 is exposed from the insulating film in the opening. Likewise, as shown in FIG. 3, a conductor pattern MPG is formed on the lower surface 10b of the wiring board 10 and is exposed. However, an insulating film (protective film, solder-resist film) with which the conductor pattern MPG is covered may be formed over the lower surface 10b.

Also, the wiring board 10 includes the plurality of board terminals (bonding leads, bonding fingers, pads, lands) 12 connected to the plurality of terminals 22 of the semiconductor device 20. The plurality of board terminals 12 include a board terminal 12A to which a signal output from the sensor 30 is input. In an example shown in FIG. 3, the terminal 22A of the semiconductor device 20 is bonded and electrically connected to the board terminal 12A via a solder SD. Also, the plurality of board terminals 12 include a board terminal 12B connected to an inverting input terminal of the amplifier circuit OP1. Also, the plurality of board terminals 12 include a board terminal 12T connected to the output terminal of the amplifier circuit OP1. Also, the plurality of board terminals 12 include a board terminal 12P forming a transmission path which supplies a high-side potential (positive potential, for example) to the amplifier circuit OP1. Also, the plurality of board terminals 12 include a board terminal 12N forming a transmission path which supplies a low-side potential (negative potential or ground potential, for example) which is lower than the high-side potential, to the amplifier circuit OP1.

Also, the wiring board 10 includes a plurality of board terminals 13 in which the sensor 30 or the resistor component 40 is mounted. The plurality of board terminals 13 include a board terminal 13A connected to the electrode 30E1 of the sensor 30 and the electrode 40E1 of the resistor component 40. The electrode 30E1 of the sensor 30 on an output side thereof is bonded to the board terminal 13A via a bonding material (not shown) such as a solder. Also, the electrode 40E1 of the resistor component is bonded to the board terminal 13A via a bonding material (not shown) such as a solder. Also, the plurality of board terminals 13 include a board terminal 13L which is connected to the electrode 30E2 of the sensor 30 and supplies a low-side reference potential to the sensor 30. To the board terminal 13L, a reference potential such as a ground potential, for example, is supplied via a via wire VWL. Also, the plurality of board terminals 13 include a board terminal 13H which is connected to the electrode 40E2 of the resistor component 40 and supplies a high-side reference potential to the resistor component 40. To the board terminal 13H, a reference potential which is higher than a ground potential, for example, is supplied via a via wire VWH.

Also, the wiring board 10 includes the plurality of wires 11 connected to the plurality of board terminals 12. The plurality of wires 11 include a wire 11A connected to the board terminal 12A. A signal output from the sensor 30 is input to the amplifier circuit OP1 of the semiconductor device 20 via the electrode 30E1 serving as an output terminal, the board terminal 13A, the wire 11A, the board terminal 12A, and the terminal 22A. Also, the plurality of wires 11 include a wire 11B connected to the board terminal 12B. The wire 11B is electrically connected to the board terminal 12T via a resistive element R2 shown in FIG. 2. Also, the plurality of wires 11 include a wire 11T connected to the board terminal 12T. An output signal of the amplifier circuit OP1 is output to the wire 11T via the terminal 22T serving as an external terminal of the semiconductor device 20 and the board terminal 12T of the wiring board 10.

In a case where a signal is amplified by the amplifier circuit OP1 as with the electronic device EDV1, it is preferable to filter noise of a signal before being amplified, that is, a signal which is yet to be input to the amplifier circuit OP1. For this reason, as shown in FIG. 2, in the electronic device EDV1, a noise filter (low-pass filter) NF1 including a resistor AR1, an inductor AL1, and a capacitor AC1 is connected between the board terminal 13A which is an output end of the sensor 30 and the board terminal 12A which is an input end of the amplifier circuit OP1.

In a case in which a filter circuit like the noise filter NF1 is connected, there is a method in which electronic components corresponding to the resistor AR1, the inductor AL1, and the capacitor AC1 which are shown in FIG. 2 are prepared, respectively, and the components are mounted on the wiring board 10. However, as the number of electronic components mounted on the wiring board 10 increases, restriction on a layout of components and wires becomes greater, which causes an increase of an area of the wiring board 10. Also, when discrete devices (single-function components) are gathered, respective components may interfere with one another because interference with other components is not taken into consideration, and as a result, a new noise source may be generated, in some cases.

In view of this, the present inventors have made a study of a technique of forming the noise filter NF1 using a conductor pattern formed in the wiring board 10. First, the resistor AR1 and the inductor AL1 shown in FIG. 2 can be replaced by the wire 11A shown in FIG. 1. More specifically, by adjusting a length (extending distance) and a width (a length in a direction orthogonal to an extending direction which is a longitudinal direction) of the wire 11A, it is possible to provide functions of the resistor AR1 and the inductor AL1 to the wire 11A. However, it is difficult to provide the function of the capacitor AC1 to the wire 11A because the function of the capacitor AC1 affects planar areas of electrodes which are arranged so as to face each other via a dielectric member.

For example, as a study example for FIG. 1, in a case where a via wire VWA and the conductor pattern MPc are not connected to the wire 11A, assuming that the wire 11A itself serves as an RLC filter circuit, respective values of components of the RLC filter circuit are as follows. That is, under calculation conditions described later, a resistance value at the board terminal 12A of the RLC filter circuit is 32.82 [mΩ] (milliohm), an inductance value is 2.62 [nH] (nanohenry), and a capacitance value is 0.53 [pF] (picofarad). Calculation conditions for the above-stated calculated values are as follows. It is assumed that the wire 11A shown in FIG. 1 has a length (a distance of a path between the board terminal 13A and the board terminal 12A) of 5 mm, a width (a length of an extending portion 11L1 in a Y direction) of 0.4 mm, and a thickness (a length in a Z direction shown in FIG. 3) of 60 μm.

In the above-described RLC filter circuit, a frequency at which output power is half of that in a pass band, that is, a cutoff frequency, is approximately 4.25 GHz (gigahertz). However, in an on-vehicle electronic device, for example, a frequency of noise, of which influence upon a signal output from the sensor 30 shall be taken into consideration, is substantially 150 kHz (kilohertz) or more and 2 GHz or less. Accordingly, using the RLC filter circuit with a cutoff frequency of approximately 4.25 GHz is difficult as a noise filter in a frequency band of substantially 150 kHz or more and 2 GHz or less. In other words, a noise filter used in a frequency band of substantially 150 kHz or more and 2 GHz or less should have a cutoff frequency of 2 GHz or less, at the highest.

As a method of reducing a cutoff frequency, a method of increasing a value of the capacitor AC1 shown in FIG. 2 is effective. However, in order to increase a value of the capacitor AC1, planar areas of electrodes which are arranged so as to face each other with a dielectric member interposed therebetween should be increased. Thus, to provide a conductor pattern forming the capacitor AC1 in the same layer where the plurality of wires 11 shown in FIG. 1 are provided would cause an increase of the area of the wiring board 10.

In the case of the electronic device EDV1, as shown in FIG. 3, the wiring board 10 is a multilayer wiring board including a plurality of wiring layers WL1, WL2, WL3, and WL4. Accordingly, the conductor patterns MPc and MPg corresponding to the capacitor AC1 shown in FIG. 2 are respectively formed in the wiring layers WL3 and WL2 different from the wiring layer WL1 where the wire 11A is formed.

As shown in FIG. 3, the wiring board 10 includes the wiring layer WL1 where the wire 11A is arranged. Each of the plurality of wires 11 shown in FIG. 1 is formed in the wiring layer WL1 like the wire 11A. In this manner, by providing the plurality of wires 11 in the same wiring layer WL1, it is possible to shorten a wiring-path distance. Also, in an example shown in FIG. 3, the board terminals 12A and 13A are also formed in the wiring layer WL1. In other words, the wire 11A is formed in an uppermost layer out of the plurality of wiring layers included in the wiring board 10. However, in a modification example, the plurality of wires 11 may be provided in a wiring layer lower than the uppermost layer while the plurality of board terminals 12 and the plurality of board terminals 13 shown in FIG. 1 are provided in the uppermost layer. In this case, the plurality of wires 11 and the plurality of board terminals 12 are connected via the via wire VW which is an interlayer conducting path.

Also, the electronic device EDV1 includes the conductor pattern MPc which is formed in the wiring layer WL3 different from the wiring layer WL1 and is electrically connected to the wire 11A via the via wire VWA. Also, the electronic device EDV1 includes the conductor pattern MPg which is formed in the wiring layer WL2 different from the wiring layer WL1 and the wiring layer WL3 and is supplied with a fixed potential. In an example shown in FIG. 3, the conductor pattern (ground plane) MPG to which a ground potential is supplied is arranged in the wiring layer WL4, and the conductor pattern MPg is electrically connected to the conductor pattern MPG via a via wire VWG. Accordingly, the conductor pattern MPg is supplied with a ground potential. Almost all of the lower surface 10b of the wiring board 10 is covered with the conductor pattern MPG. Also, the conductor pattern MPc and the conductor pattern MPg face each other with an insulating layer 14 interposed therebetween. In a region where the conductor pattern MPc and the conductor pattern MPg face each other, the capacitor AC1 shown in FIG. 2 is formed.

Also, since each of the conductor patterns MPc and MPg is formed in a wiring layer other than the wiring layer WL1, each of the conductor patterns MPc and MPg is not likely to receive restriction on a layout of the plurality of wires 11 shown in FIG. 1. Accordingly, areas of the conductor patterns MPc and MPg can be increased. Thus, as shown in FIG. 1, an area of the region where the conductor pattern MPc and the conductor pattern MPg face each other is larger than an area of the wire 11A. For example, in an example shown in FIG. 1, the conductor pattern MPc has a quadrangular shape (specifically, a rectangular shape), and an area thereof is 20.16 mm². Also, the conductor pattern MPg is formed in most part of the wiring layer WL2 except an opening MPh through which the via wire VW passes and a peripheral edge portion of the wiring board 10. Accordingly, even if an area of the opening MPh is taken into consideration, the area of the region where the conductor pattern MPc and the conductor pattern MPg face each other is approximately 20 mm². Meanwhile, the wire 11A has a length (a distance of a path between the board terminal 13A and the board terminal 12A) of 5 mm and a width (a length of the extending portion 11L1 in the Y direction) of substantially 0.4 mm, and thus, the area of the wire 11A is approximately 2 mm². Accordingly, a capacitance value of the capacitor AC1 shown in FIG. 2 can be increased.

In a layout shown in FIG. 1 and FIG. 3, for example, at the board terminal 12A of the noise filter NF1 shown in FIG. 2, a resistance value is 36.34 [mΩ], an inductance value is 2.73 [nH], and a capacitance value is 9.60 [pF]. The above-described values are obtained as a result of calculation performed under the following conditions. That is, it is assumed that the wire 11A has a length of 5 mm, a width of 0.4 mm, and a thickness of 60 μm. Also, it is assumed that a thickness of the conductor pattern formed in each of the wiring layer WL2 and the wiring layer WL3 is 35 μm and a thickness of the conductor pattern formed in the wiring layer WL4 is 60 μm. Also, it is assumed that a thickness of each of an insulating layer 14A between the wiring layer WL1 and the wiring layer WL2 and an insulating layer 14B between the wiring layer WL3 and the wiring layer WL4 is 600 μm and a thickness of an insulating layer 14C between the wiring layer WL2 and the wiring layer WL3 is 100 μm.

Under the above-described calculation conditions, a cutoff frequency of the noise filter NF1 shown in FIG. 2 is 0.98 GHz. A noise filter having such a degree of the cutoff frequency can be sufficiently used as a noise filter used in a frequency band of substantially 150 kHz or more and 2 GHz or less. Further, by adjusting a length, a width, or a thickness of the wire 11A shown in FIG. 1, or adjusting the area of the region where the conductor pattern MPc and the conductor pattern MPg face each other, it is possible to easily adjust a cutoff frequency of the noise filter NF1.

For example, while a width of the wire 11A shown in FIG. 1 is 0.4 mm as described above, in a case where a width of the wire 11A is changed from 0.4 mm to 0.1 mm, at the board terminal 12A of the noise filter NF1 (see FIG. 2), a resistance value is 69.86 [mΩ], an inductance value is 3.78 [nH], and a capacitance value is 9.56 [pF]. In this case, a cutoff frequency is 0.85 GHz.

As described above, according to the present embodiment, the conductor pattern MPc (see FIG. 3) and the conductor pattern MPg (see FIG. 3) which constitute the capacitor AC1, out of the resistor AR1, the inductor AL1, and the capacitor AC1 which constitute the noise filter NF1 shown in FIG. 2, are formed in a wiring layer different from a layer of the wire 11A (see FIG. 1). Accordingly, even if the capacitance value of the capacitor AC1 is made greater enough to make the noise filter usable as a noise filter, restriction on a wiring layout in the wiring layer WL1 (see FIG. 3) is unlikely to be caused. Also, as shown in FIG. 3, in the electronic device EDV1, the noise filter NF1 (see FIG. 2) is formed of a conductor pattern (also including the wire 11A) of the wiring board 10 without additionally providing an electronic component for a noise filter. Accordingly, an increase of the area of the wiring board 10 caused by connection of the noise filter NF1 can be prevented. Also, in a case where the noise filter NF1 is formed of the conductor pattern of the wiring board 10, it is possible to design, taking electromagnetic influence of the noise filter NF1 upon other wires into consideration. Thus, generation of new noise can be prevented due to unintended electromagnetic interference between the components.

Also, as with the present embodiment, in a case where noise included in an input signal of the amplifier circuit OP1 shown in FIG. 2 is reduced, it is preferable that a position where the capacitor AC1 of the noise filter NF1 which is a low-pass filter is connected is close to the input end of the amplifier circuit OP1. A shorter distance between the position where the capacitor AC1 is connected and the input end of the amplifier circuit OP1 can prevent a filtered signal from being provided with different noise again.

According to the present embodiment, a signal transmitted to the board terminal 12A shown in FIG. 1 is an input signal input to the amplifier circuit OP1 of the semiconductor device 20 via the terminal 22A. Also, the wire 11A includes the extending portion 11L1 extending in the X direction and a via land portion 11VP connected to the via wire VWA. The via land portion 11VP is located between the extending portion 11L1 and the board terminal 12A in plan view. Also, in plan view, a separation distance between the board terminal 12A and the via land portion 11VP is shorter than a distance (length) over which the extending portion 11L1 extends. That is, the via land portion 11VP connected to the capacitor AC1 shown in FIG. 2 is arranged close to the board terminal 12A which is the input end of the amplifier circuit OP1.

Also, a configuration according to the present embodiment can be also represented as follows. More specifically, the sensor 30 connected to the wire 11A is mounted on the wiring board 10. A signal transmitted to the board terminal 12A is output from the sensor 30 and is input to the amplifier circuit OP1 of the semiconductor device 20 via the terminal 22A. Also, the wire 11A includes the extending portion 11L1 extending in the X direction and the via land portion 11VP connected to the via wire VWA. The via land portion 11VP is located between the extending portion 11L1 and the board terminal 12A in plan view. Also, in plan view, a separation distance between the sensor 30 and the via land portion 11VP is longer than a separation distance between the board terminal 12A and the via land portion 11VP. In other words, the via land portion 11VP connected to the capacitor AC1 shown in FIG. 2 is arranged closer to the board terminal 12A which is the input end of the amplifier circuit OP1, than the board terminal 13A which is the output end of the sensor 30.

Figure 4:
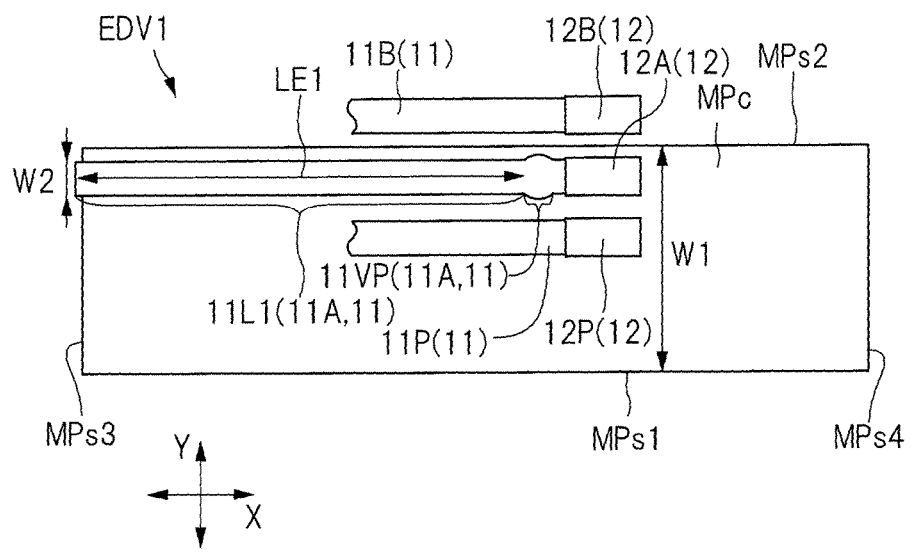
FIG. 4 is an overlapping plan view extracting wires connected to the sensor, board terminals, and a conductor pattern connected to the wires, which are shown in FIG. 1.

Also, the capacitance value of the capacitor AC1 shown in FIG. 2 is determined by the area of the region where the conductor pattern MPc and the conductor pattern MPg shown in FIG. 3 face each other. For example, in a case where a planar shape of the conductor pattern MPc shown in FIG. 1 is a shape which slenderly extends like the wire 11A, a resistance element and an inductance element provided to the conductor pattern MPc are increased. From a viewpoint of reducing the resistance element and the inductance element provided to the conductor pattern MPc, it is preferable that the conductor pattern MPc has a low aspect ratio in plan view. For example, according to the present embodiment, as shown in FIG. 4, the conductor pattern MPc has a longer side (side) MPs1 extending in the X direction, and a longer side MPs2 located opposite to the longer side MPs1. FIG. 4 is an overlapping plan view extracting the wires connected to the sensor, the board terminals, and the conductor pattern connected to the wire, which are shown in FIG. 1. Also, the conductor pattern MPc has a shorter side MPs3 extending in the Y direction which crosses the X direction, and a shorter side MPs4 located opposite to the shorter side MPs3. A length of each of the longer sides MPs1 and MPs2 is larger than a length of each of the shorter sides MPs3 and MPs4. Also, in the Y direction, a separation distance (width W1) between the longer side MPs1 and the longer side MPs2 is larger than a width W2 of the extending portion 11L1 of the wire 11A. In other words, the conductor pattern MPc has a width larger than that of the wire 11A. Accordingly, the resistance element and the inductance element provided to the conductor pattern MPc can be reduced.

Meanwhile, the wire 11A functions as both of the resistor AR1 and the inductor AL1 shown in FIG. 2, and accordingly, it is preferable that the extending portion 11L1 shown in FIG. 4 has a long narrow shape with a high aspect ratio. In an example shown in FIG. 4, a length LE1 of the extending portion 11L1 of the wire 11A in the X direction is larger than the separation distance (width W1) between the longer side MPs1 and the longer side MPs2. In FIG. 4, a total length of the wire 11A is 5 mm, for example. In contrast, a width (a length in the Y direction) of the extending portion 11L1 of the wire 11A is 0.4 mm. Accordingly, the length of the wire 11A is ten times or more the width of the extending portion 11L1 of the wire 11A.

Also, as shown in FIG. 4, the conductor pattern MPc and the wire 11 overlap with each other in plan view. More specifically, the wire 11A includes the extending portion 11L1 extending in the X direction, and the via land portion 11VP connected to the via wire VWA (see FIG. 3). The conductor pattern MPc and the extending portion 11L1 of the wire 11A overlap with each other in plan view. In such a case where the extending portion 11L1 of the wire 11A and the conductor pattern MPc overlap with each other, flexibility in a layout in forming a conductor pattern other than the conductor pattern MPc in the wiring layer WL2 is improved.

Meanwhile, as shown in FIG. 4, the conductor pattern MPc overlaps with the board terminal 12P and a wire 11P connected to the board terminal 12P in plan view. The board terminal 12P forms a transmission path which supplies a high-side potential (positive potential, for example) to the amplifier circuit OP1 shown in FIG. 1, as described above. For this reason, when another conductor pattern is not interposed between the conductor pattern MPc and the wiring layer WL1 (see FIG. 6 described later), a potential supplied to the board terminal 12P and the wire 11P may electromagnetically affect the conductor pattern MPc, in some cases.

However, according to the present embodiment, as shown in FIG. 3, the conductor pattern MPg to which a fixed potential is supplied is interposed between the conductor pattern MPc and the wiring layer WL1. In this case, the conductor pattern MPg functions as a shield conductor layer which reduces an electromagnetic wave toward the conductor pattern MPc. In order to allow the conductor pattern MPg to function as a shield conductor layer, it is particularly preferable that a potential supplied to the conductor pattern MPg is a ground potential, as with the present embodiment.

In a case where the conductor pattern MPg serving as a shield conductor layer is interposed between the wiring layer WL1 and the wiring layer WL3, flexibility in a planar shape of the conductor pattern MPc is improved. For example, as shown in FIG. 4, in a case where a planar shape of the conductor pattern MPc is a quadrangle, it is easy to design a capacitance of the capacitor AC1 shown in FIG. 2. In the example shown in FIG. 4, the conductor pattern MPc overlaps with the board terminal 12P and the wire 11P connected to the board terminal 12P in plan view. However, the conductor pattern MPg shown in FIG. 3 is interposed between the board terminal 12P and the wire 11P, and the conductor pattern MPc. Accordingly, electromagnetic influence of the board terminal 12 and the wire 11P upon the conductor pattern MPc is considerably reduced.

Also, as with the present embodiment, in a case where the wire 11A and the conductor pattern MPg are arranged so as to face each other with the insulating layer 14A interposed therebetween, a capacitance is formed between the wire 11A and the conductor pattern MPg. As described above, while a value of a capacitance formed by the wire 11A is not so large, in a case where a capacitance is formed by the conductor pattern MPc and a further capacitance is formed by the wire 11A as with the present embodiment, it is easy to finely adjust a capacitance value.

Figure 5:
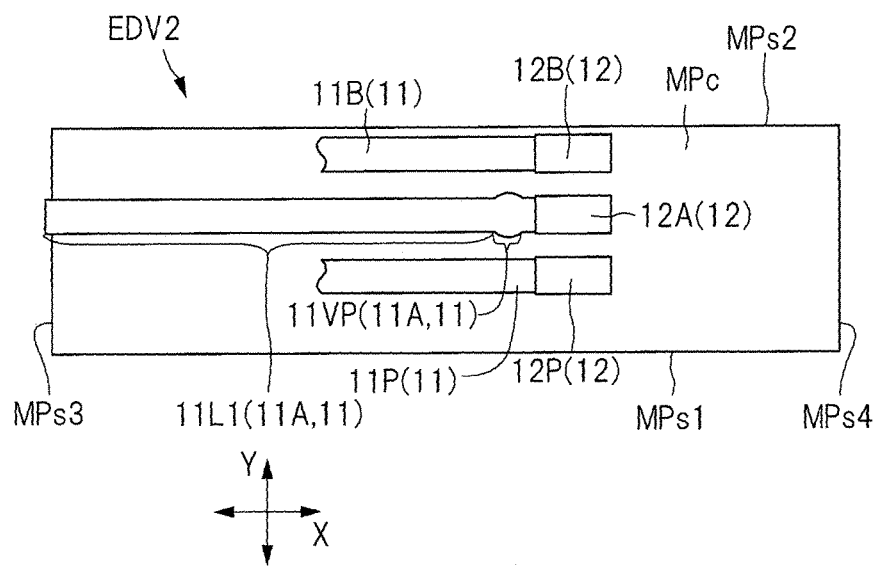
FIG. 5 is an overlapping plan view showing a modification example of FIG. 4.

Also, in a case where the conductor pattern MPg serving as a shield conductor layer is interposed between the wiring layer WL1 and the wiring layer WL3, an electronic device EDV2 shown in FIG. 5 can be conceived as a modification example. FIG. 5 is an overlapping plan view showing a modification example of FIG. 4. The electronic device EDV2 is different from the electronic device EDV1 shown in FIG. 4 in that the conductor pattern MPc overlaps with the board terminal 12B and the wire 11B in plan view.

The board terminal 12B and the wire 11B constitute a transmission path for an input signal, which is connected to an inverting input terminal of the amplifier circuit OP1 shown in FIG. 1. For this reason, a signal current different from a signal current flowing through the board terminal 12A and the wire 11A which are connected to a non-inverting input terminal, flows through the board terminal 12B. In the electronic device EDV2, like the electronic device EDV1 shown in FIG. 3, the conductor pattern MPg is arranged in the wiring layer WL2, and the conductor pattern MPc is arranged in the wiring layer WL3. Accordingly, the conductor pattern MPg shown in FIG. 3 is interposed between the conductor pattern MPc and the board terminal 12B shown in FIG. 5. As a result, even in a case where the conductor pattern MPc overlaps with the board terminal 12B in plan view as shown in FIG. 5, mutual electromagnetic influence between the conductor pattern MPc and the board terminal 12B can be reduced. In this manner, in a case where the wiring layer WL2 in which the conductor pattern MPg is arranged is provided between the wiring layer WL3 in which the conductor pattern MPc is arranged and the wiring layer WL1 in which the wire 11A is arranged, flexibility in a layout of the wire 11 and the conductor pattern MPc shown in FIG. 1 is improved.

Figure 6:
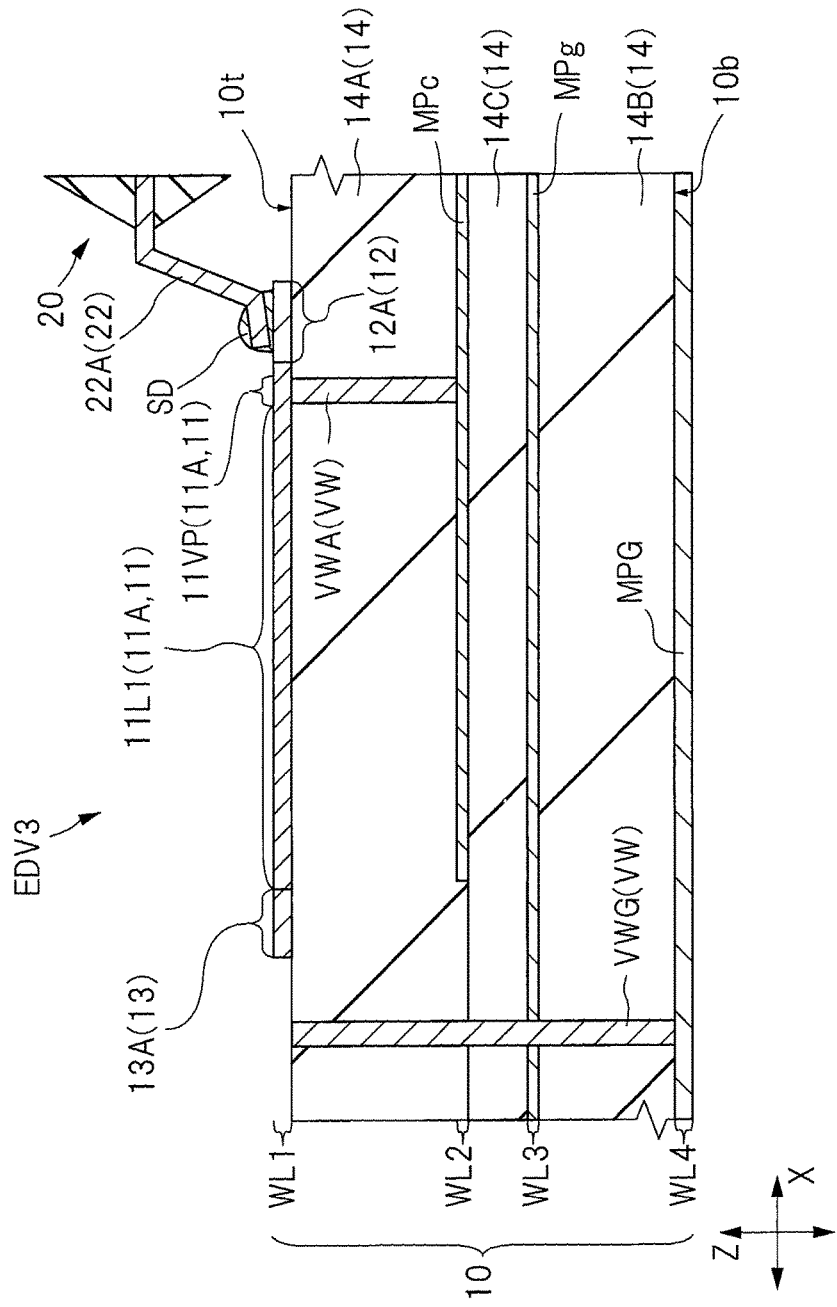
FIG. 6 is an enlarged cross-sectional view of an electronic device according to a modification example of FIG. 3.
Figure 7:
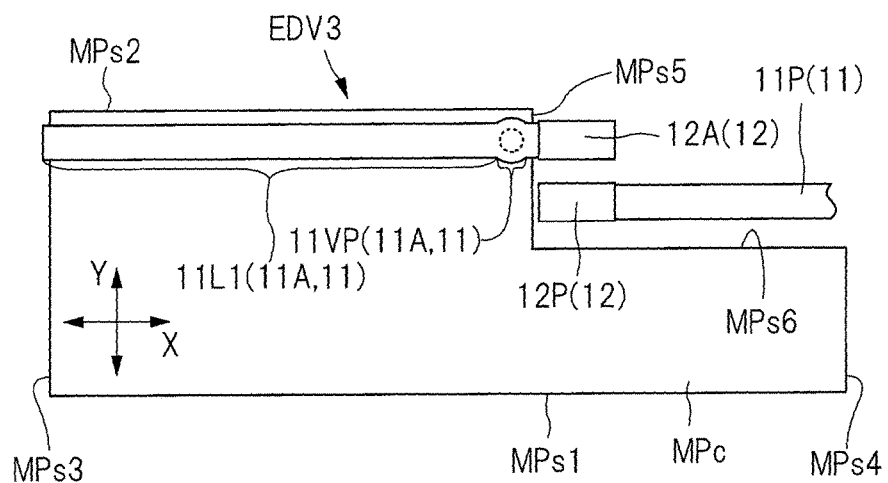
FIG. 7 is an overlapping plan view showing the modification example of FIG. 4, in the electronic device shown in FIG. 6.

Also, as another modification example of the electronic device EDV1, a configuration of an electronic device EDV3 shown in FIG. and FIG. 7 can be exemplified. FIG. 6 is an enlarged cross-sectional view of an electronic device according to a modification example of FIG. 3. FIG. 7 is an overlapping plan view showing the modification example of FIG. 4, in the electronic device shown in FIG. 6.

The electronic device EDV3 shown in FIG. 6 is different from the electronic device EDV1 shown in FIG. 3 in that the conductor pattern MPc is arranged between the conductor pattern MPg and the wire 11A. Also, as shown in FIG. 7, the electronic device EDV3 is different from the electronic device EDV1 shown in FIG. 4 in that the board terminal 12P and the conductor pattern MPc do not overlap with each other in plan view. Also, while a planar shape of the conductor pattern MPc is a rectangle in the electronic device EDV1 shown in FIG. 4, there are various modification examples of a planar shape of the conductor pattern MPc. For example, the conductor pattern MPc included in the electronic device EDV3 shown in FIG. 7 has a shorter side MPs4 and a shorter side MPs5 which are located opposite to the shorter side MPs3, and also has a side MPs6 which is located between the shorter side MPs4 and the shorter side MPs5 in the X direction and located between the longer side MPs1 and the longer side MPs2 in the Y direction. The conductor pattern MPc shown in FIG. 7 do not overlap with the board terminal 12P in plan view. Also, in the X direction, the wire 11A extends from the board terminal 12A toward the board terminal 13A shown in FIG. 6. In contrast, in the X direction, the wire 11P extends from the board terminal 12P in a direction opposite to the wire 11A (in other words, in a direction away from the board terminal 13A shown in FIG. 6). In the electronic device EDV3, because of the above-described layout of the conductor pattern, the conductor pattern MPc does not overlap with the wire 11P connected to the board terminal 12P in plan view.

The board terminal 12P constitutes a transmission path which supplies a high-side potential (positive potential, for example) to the amplifier circuit OP1 shown in FIG. 1, as described above. As compared to the board terminal 12B (see FIG. 1) for a signal, the board terminal 12P for power supply has a relatively small electromagnetic influence even when overlapping with the conductor pattern MPc. Accordingly, in a modification example of the electronic device EDV3, the board terminal 12P and the wire 11P may overlap with the conductor pattern MPc in plan view in the same manner as in the electronic device EDV1 shown in FIG. 4. However, from a viewpoint of further reducing influence of a potential supplied to the board terminal 12P and the wire 11P upon the conductor pattern MPc, it is preferable that the board terminal 12P and the wire 11P do not overlap with the conductor pattern MPc in plan view as shown in FIG. 7.

Also, as shown in FIG. 3, in the case of the electronic device EDV1, the via wire VWA passes through the wiring board 10 in its thickness direction (in the Z direction shown in FIG. 3). In contrast, in the case of the electronic device EDV3 shown in FIG. 6, the via wire VWA does not pass through the wiring board 10 and is arranged between the wiring layer WL2 and the wiring layer WL1.

As shown in FIG. 3, the via wire VWA passing through the wiring board 10 in the thickness direction is formed in such a manner that a through hole penetrating the wiring board 10 in the thickness direction is formed after stacking respective wiring layers of the wiring board 10 and a conductor material is buried in the through hole. In contrast, the via wire VWA which does not pass through the wiring board 10 as shown in FIG. 6 is formed by the build-up method, for example.

In a case of the via wire VWA passing through the wiring board 10 in the thickness direction as shown in FIG. 3, a lower end (a portion between the wiring layer WL3 and the wiring layer WL4) of the via wire VWA may function as a stub, in some cases. That is, depending on a length of a lower end of the via wire VWA, transmission of a signal in a specific frequency band may be disturbed by resonance of a stub of the via wire VWA. As shown in FIG. 2, regarding a transmission path into which a low-pass filter is inserted, there arises no serious problem, inmost cases. However, in a case where a frequency of a signal is relatively high, it is preferable to use the via wire VWA which does not pass through the wiring board 10 as shown in FIG. 6 from a viewpoint of preventing necessary signal transmission from being disturbed. Meanwhile, from a viewpoint of easiness in manufacture, the via wire VWA passing through the wiring board 10 as shown in FIG. 3 can be more easily formed.

Various types of via wires VW will be described below in the present specification. Regarding a shape of the via wire VW, the via wire VW may pass through the wiring board 10 like the via wire VWA shown in FIG. 3 or may not pass through the wiring board 10 like the via wire VWA shown in FIG. 6. However, in the case of the via wire VW constituting a bandpass filter or a high-pass filter described later in the fourth embodiment, the via wire VW may function as a stub, in some cases. When, of the via wire VWA shown in FIG. 3, a length of a portion thereof from the wiring layer WL3 to the wiring layer WL4 is ¼ the wavelength of a frequency desired to be passed, for example, a signal current in such frequency band has difficulty in passing through the via wire VW due to resonance. In a case where a bandpass filter or a high-pass filter is connected, the via wire VW is used for transmitting a high-frequency signal, and accordingly, stub resonance may occur. For this reason, in a case where the via wire VW constitutes a bandpass filter or a high-pass filter, it is preferable that the via wire VW does not pass through the wiring board 10, like the via wire VWA shown in FIG. 6.

Figure 8:
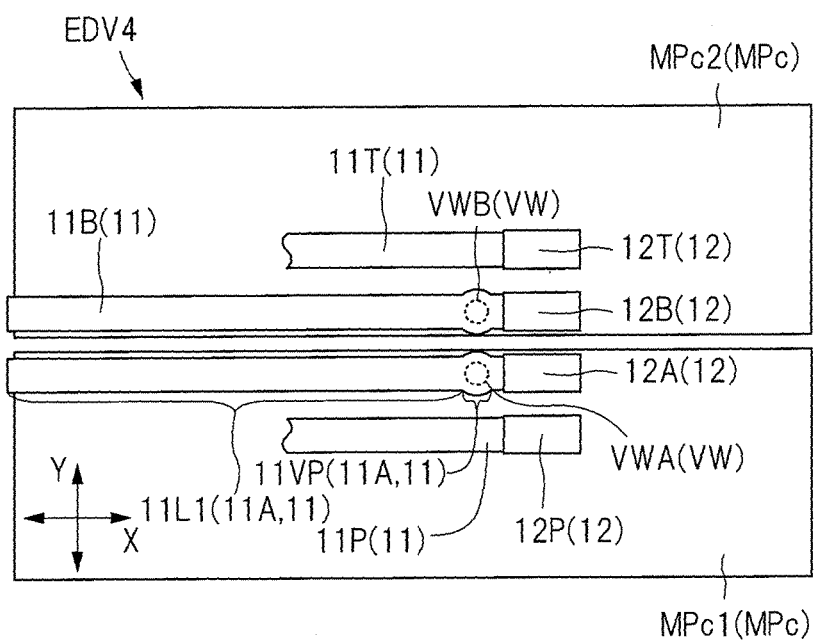
FIG. 8 is an overlapping plan view showing another modification example of FIG. 4.

Also, with reference to FIG. 1, a mode in which the wire 11A which is one input path for a signal and the conductor pattern MPc are electrically connected has been described. However, in a modification example, the wire 11A and the wire 11B which are input paths for signals may be connected to divided pieces of the conductor pattern MPc, respectively, as with an electronic device EDV4 shown in FIG. 8. FIG. 8 is an overlapping plan view showing another modification example of FIG. 4.

In the case of the electronic device EDV4 shown in FIG. 8, the wire 11A connected to the non-inverting input terminal of the amplifier circuit OP1 (see FIG. 1) is electrically connected to a conductor pattern MPc1 via the via wire VWA. Also, the wire 11B connected to the inverting input terminal of the amplifier circuit OP1 is electrically connected to a conductor pattern MPc2 via a via wire VWB. The conductor patterns MPc1 and MPc2 are separated from each other and formed in the wiring layer WL2 shown in FIG. 3, for example. Also, the conductor pattern MPg is formed in the wiring layer WL2 in the same manner as in the electronic device EDV1 shown in FIG. 3. Each of the conductor patterns MPc1 and MPC2 faces the conductor pattern MPg with the insulating layer 14C interposed therebetween. The conductor pattern MPc1 constitutes apart of the capacitor AC1 of the noise filter NF1 shown in FIG. 2 in a transmission path connected to the non-inverting input terminal of the amplifier circuit OP1. Also, the conductor pattern MPc2 constitutes apart of a capacitor of a noise filter (low-pass filter) in a transmission path connected to the inverting input terminal of the amplifier circuit OP1.

In the case of the electronic device EDV4, a noise filter is provided in each of input paths for signals input to the amplifier circuit, so that noise influence upon each transmission path can be reduced. Such a configuration as that of the electronic device EDV4 is particularly effective when being applied to a differential amplifier circuit in which respective signals independent from each other are input to an inverting input terminal and a non-inverting input terminal and a difference in the two input signals is amplified in accordance with a differential gain.

Second Embodiment

Figure 9:
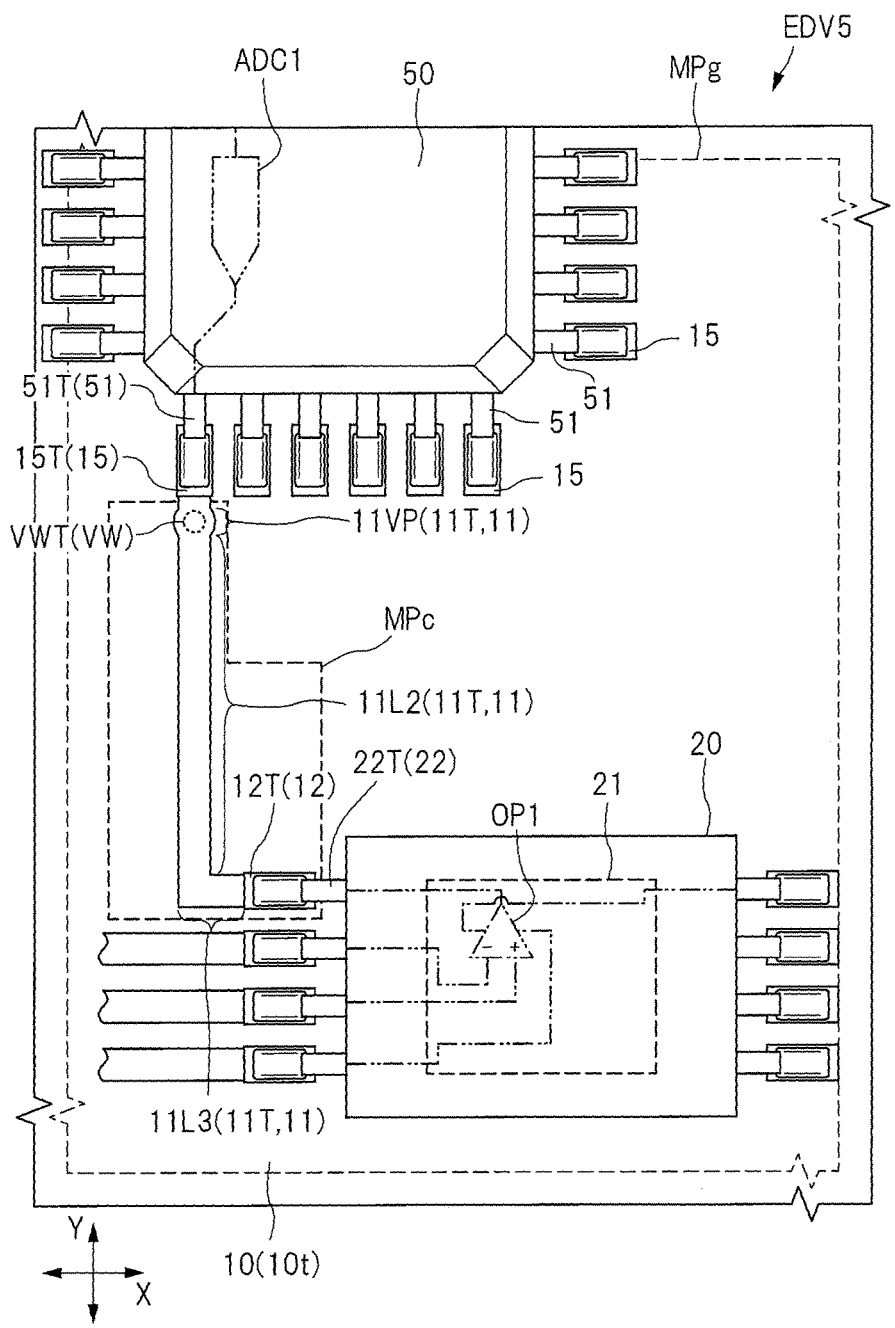
FIG. 9 is an enlarged plan view showing an example of a configuration of an electronic device according to a modification example of FIG. 1.
Figure 10:
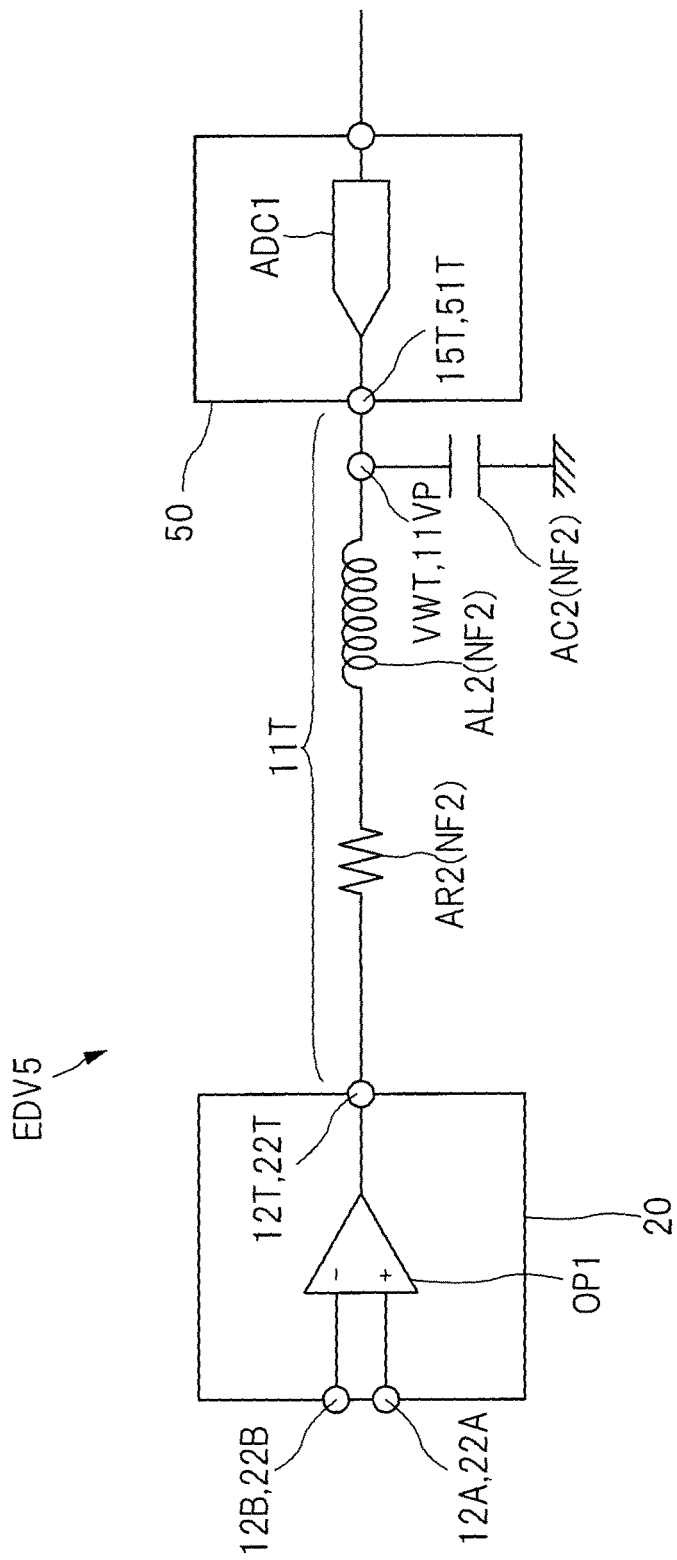
FIG. 10 is a diagram of an equivalent circuit of a path electrically connecting an amplifier circuit and an analog conversion circuit shown in FIG. 9.

In the above-described first embodiment, a mode in which a low-pass filter filtering noise of an output signal from a sensor before the signal is input to an amplifier circuit is connected has been described as one example of the EMS countermeasures. In the second embodiment, a mode in which a noise filter filtering noise of an analog signal output from an analog circuit such as an amplifier circuit before the analog signal is input to an analog circuit of another electronic device is connected will be described as one example of the EMI countermeasures (also as another example of the EMS countermeasures). Note that a noise filter described below corresponds to a mode of the EMI countermeasure for the semiconductor device 20 including the amplifier circuit OP1 shown in FIG. 9, while the noise filter corresponds to the EMS countermeasure for a semiconductor device 50 including an analog-to-digital (AD) conversion circuit (AD converter) ADC1. FIG. 9 is an enlarged plan view showing an example of a configuration of an electronic device according to a modification example of FIG. 1. FIG. 10 is a diagram of an equivalent circuit of a path electrically connecting an amplifier circuit and an analog conversion circuit shown in FIG. 9. In the following description, duplicated description about matters similar to the techniques already described in the above first embodiment will be omitted in principle. However, the matters similar to the techniques already described in the above first embodiment may be described with reference to the drawings which have been referred to in the above-described embodiment, in some cases.

In FIG. 9, each of a conductor pattern MPc, a conductor pattern MPg, and a via wire VW serving as an interlayer conducting path, which are formed in a wiring layer different from a wiring layer in which a wire 11 is formed, is shown by a dashed line. Likewise, in FIG. 9, a semiconductor chip 21 incorporated in the semiconductor device 20 is shown by a dashed line. In FIG. 9, a part of wires connected to a plurality of board terminals 12 and a plurality of board terminals 15 is shown, and the other part is omitted. Also, in FIG. 9, each of a circuit diagram of the amplifier circuit OP1 included in the semiconductor device 20 and the AD conversion circuit ADC1 included in the semiconductor device 50 is schematically shown by a two-dot chain line.

An electronic device EDV5 shown in FIG. 9 and FIG. 10 includes the semiconductor device 20 and the semiconductor device (electronic component) 50 which are electrically connected via a wire 11T. The wire 11T is connected to an output terminal of the amplifier circuit OP1. Also, the semiconductor device 50 includes the AD conversion circuit ADC1, and the AD conversion circuit ADC1 is electrically connected to the wire 11T via a terminal (lead) 51T and a board terminal 15T. The AD conversion circuit ADC1 converts an analog signal to a digital signal.

As shown in FIG. 10, in the case of the electronic device EDV5, an analog signal output from a terminal 22T which is an output terminal of the semiconductor device 20 is input to the AD conversion circuit ADC1 of the semiconductor device 50 via the wire 11T, the board terminal 15T, and the terminal 51T. Also, in the case of the electronic device EDV5, a noise filter NF2 is connected in a transmission path electrically connecting the board terminal 15T and the board terminal 12T. In an example shown in FIG. 10, the noise filter NF2 is a low-pass filter including a resistor AR2, an inductor AL2, and a capacitor AC2.

To connect the noise filter NF2 to the latter stage of an output terminal (terminal 22T) of the semiconductor device 20 can reduce influence of noise in a transmission path (such as the wire 11T) for an analog signal upon other circuits. Also, to connect the noise filter NF2 to the former stage of an input terminal (terminal 51T) of the AD conversion circuit ADC1 including an analog circuit can reduce noise of an input signal provided to the AD conversion circuit ADC1.

As with the noise filter NF1 described with reference to FIG. 2, each of the resistor AR2, the inductor AL2, and the capacitor AC2 shown in FIG. 10 is formed of a conductor pattern of a wiring board 10 included in the electronic device EDV5. More specifically, an extending portion 11L2 of the wire 11T shown in FIG. 9 constitutes the resistor AR2 and the inductor AL2 out of the resistor AR2, the inductor AL2, and the capacitor AC2 which constitute the noise filter NF2 shown in FIG. 10. Also, a portion where the conductor pattern MPc and the conductor pattern MPg shown in FIG. 9 face each other constitutes the capacitor AC2 shown in FIG. 10. Note that the conductor pattern MPc is formed in a wiring layer WL3 in the same manner as in the electronic device EDV1 shown in FIG. 3, although illustration thereof is omitted. Also, the conductor pattern MPg is formed in a wiring layer WL2 shown in FIG. 3. Also, in a modification example of the electronic device EDV5, in the same manner as in the electronic device EDV3 shown in FIG. 6, the conductor pattern MPc may be formed in the wiring layer WL2, and the conductor pattern MPg may be formed in the wiring layer WL3.

In the meantime, in the case of the electronic device EDV5, a signal flowing through the wire 11T constituting the noise filter NF2 is output from the amplifier circuit OP1 via the terminal 22T and is input to the AD conversion circuit ADC1 of the semiconductor device 50. As such, in a case where a low-pass filter is connected in a transmission path for an output signal, the resistor AR2 and the inductor AL2 are connected between the capacitor AC2 and the board terminal 12T which is an output terminal, as shown in FIG. 10. Accordingly, in the case of the electronic device EDV5, the following layout is provided. Specifically, as shown in FIG. 9, the wire 11T includes the extending portion 11L2 extending in the Y direction and a via land portion 11VP connected to a via wire VWT. The extending portion 11L2 is located between the via land portion 11VP and the terminal 22T (board terminal 12T) in plan view.

Also, a configuration of the electronic device EDV5 can be alternatively represented as follows. Specifically, in plan view, a separation distance between the terminal 22T (board terminal 12T) and the via land portion 11VP is larger than a separation distance between the semiconductor device 50 and the via land portion 11VP.

Note that the wire 11 constituting a part of the noise filter is preferable in that, if the wire 11 can be arranged straightly in one direction, like the wire 11A shown in FIG. 1, designing is easy. However, under restriction upon a layout or the like, the wire 11 may bend at a midpoint in a wiring path, like the wire 11T shown in FIG. 9. For example, the wire 11T shown in FIG. 9 includes the extending portion 11L2 extending in the Y direction and an extending portion 11L3 extending in the X direction crossing the Y direction. In this case, the above-described separation distance between the terminal 22T (board terminal 12T) and the via land portion 11VP is a separation distance between the terminal 22T and the via land portion 11VP in the wiring path of the wire 11T, that is, a sum of a distance over which the extending portion 11L2 extends and a distance over which the extending portion 11L3 extends. Also, the above phrase "the extending portion 11L2 is located between the via land portion 11VP and the terminal 22T (board terminal 12T) in plan view" means that "the extending portion 11L2 is located between the via land portion 11VP and the terminal 22T (board terminal 12T) in the wiring path of the wire 11T."

The electronic device EDV5 shown in FIG. 9 and FIG. 10 is similar to the electronic device EDV1 shown in FIG. 1 to FIG. 3 except for the above-described respects. Accordingly, duplicated description will be omitted. Also, respective modification examples described in the above first embodiment may be used in combination to be applied to the electronic device EDV5 of the second embodiment.

Third Embodiment

In the above first and second embodiments, a method of taking countermeasures against noise in a signal transmission path by connecting a noise filter in the signal transmission path has been chiefly described as an example of the EMI countermeasures or the EMS countermeasures. Countermeasures against noise, such as the EMS countermeasure or the EMI countermeasure, may be effective for an electric power supplying path for a power-supply potential or the like, in addition to the signal transmission path, in some cases. In the third embodiment, a mode in which the EMS countermeasure or the EMI countermeasure is taken by connecting a noise filter in an electric power supplying path will be described.

Figure 11:
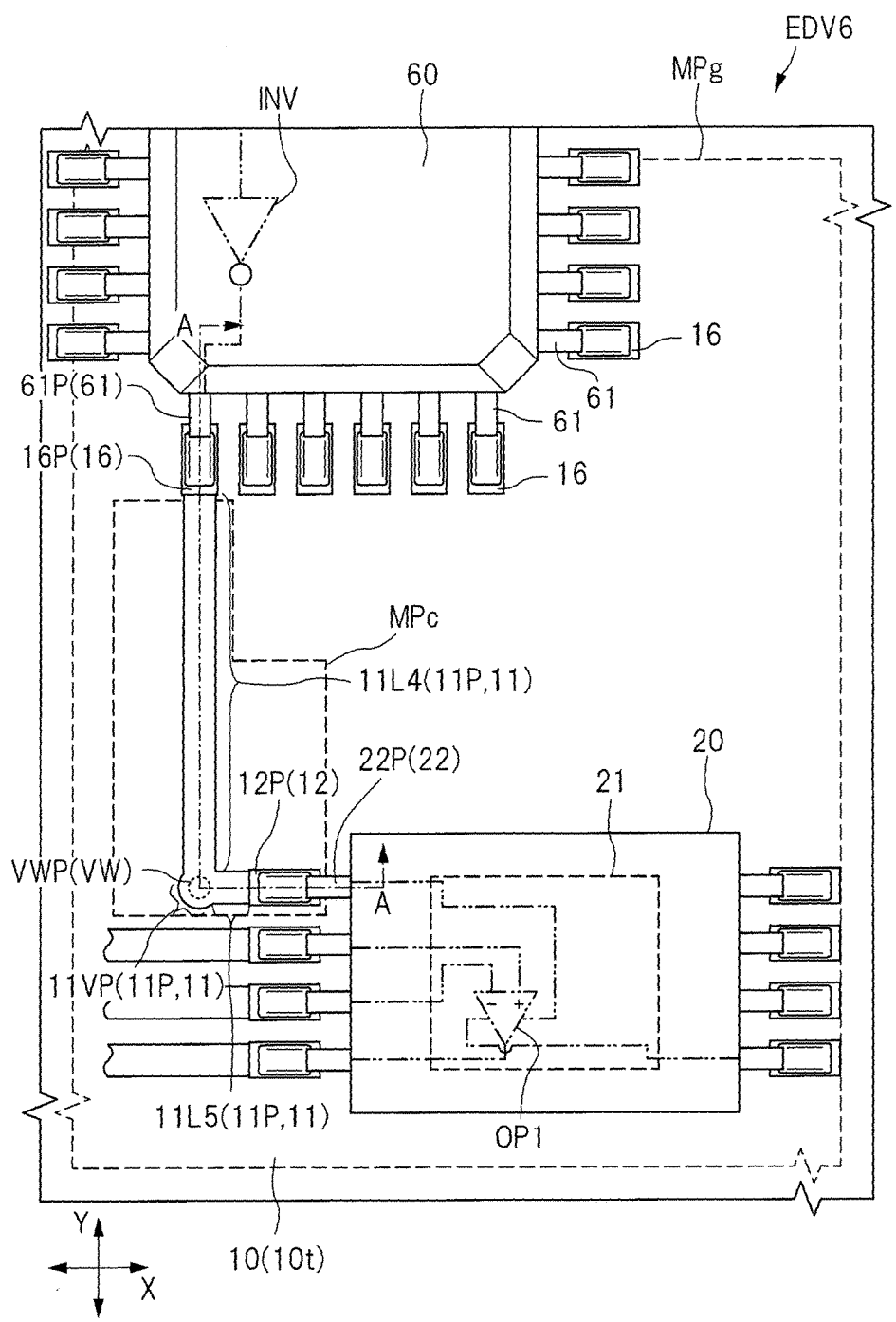
FIG. 11 is an enlarged plan view showing an example of a configuration of an electronic device in which an EMI countermeasure is taken for a power semiconductor component.
Figure 12:
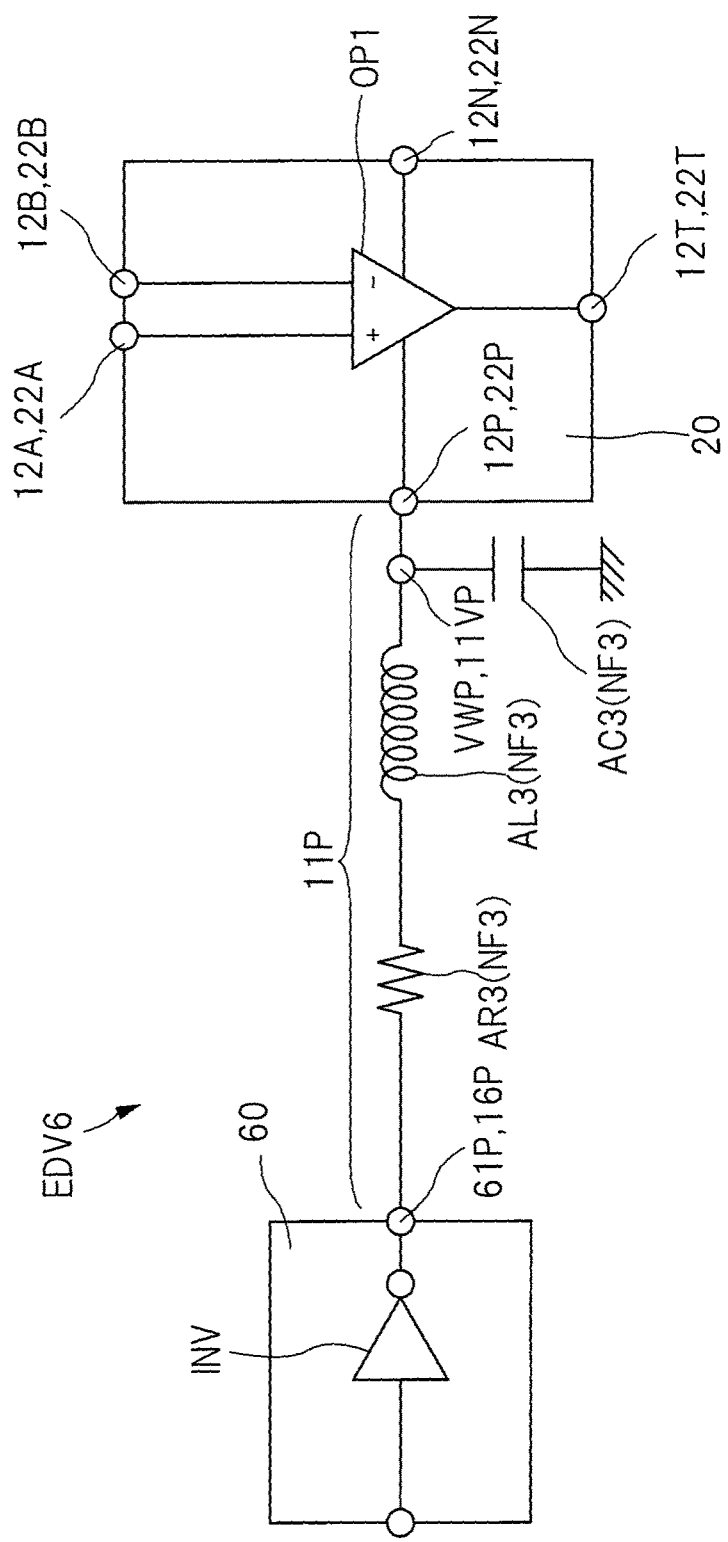
FIG. 12 is a diagram of an equivalent circuit of a path electrically connecting a semiconductor component including an amplifier circuit and a power semiconductor component supplying an electric power to the semiconductor component, which are shown in FIG. 11.
Figure 13:
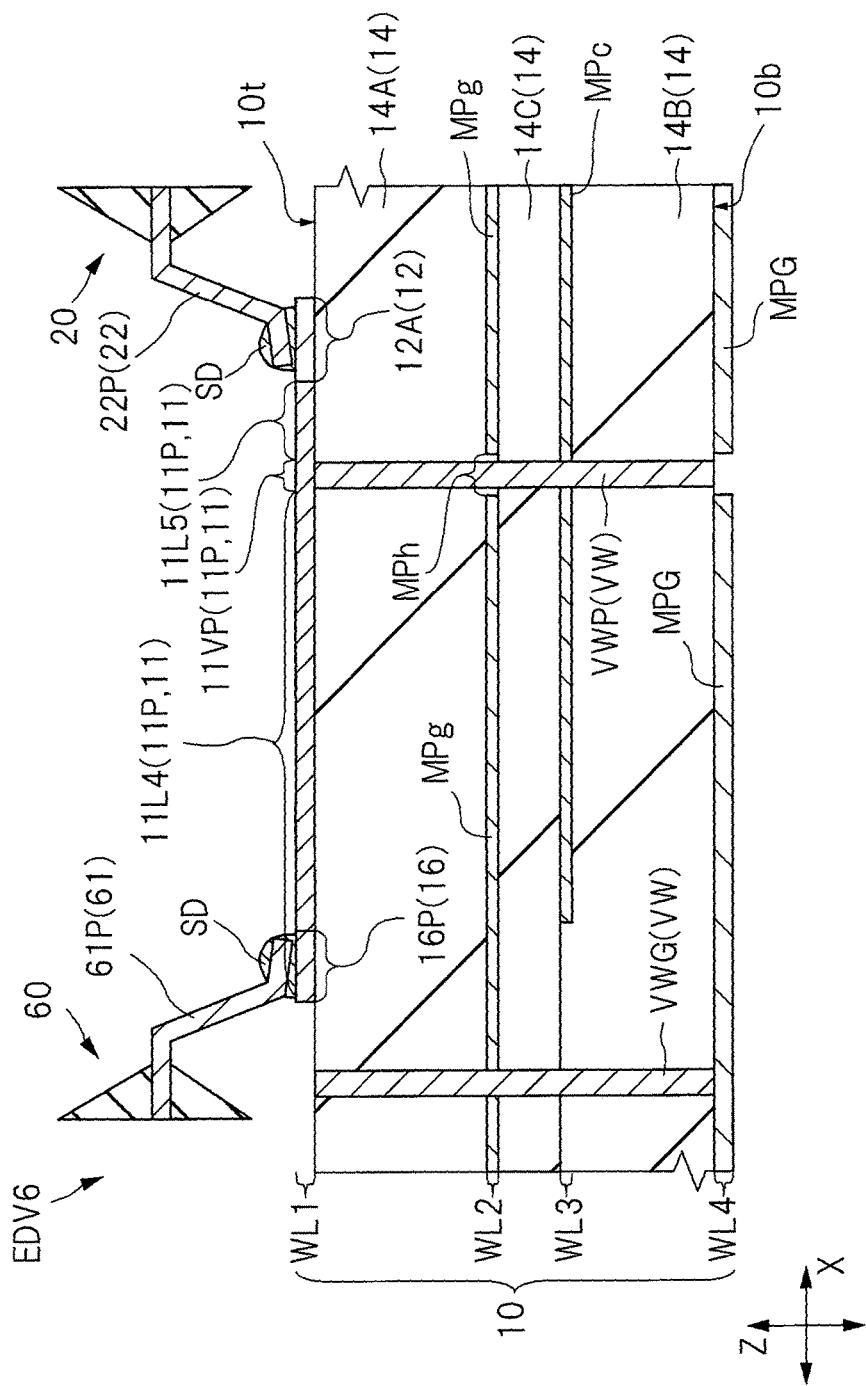
FIG. 13 is an enlarged cross-sectional view taken along a line A-A shown in FIG. 11.

FIG. 11 is an enlarged plan view showing an example of a configuration of an electronic device in which the EMI countermeasure is taken for a power semiconductor component. FIG. 12 is a diagram of an equivalent circuit of a path electrically connecting a semiconductor component including an amplifier circuit and a power semiconductor component supplying an electric power to the semiconductor component, which are shown in FIG. 11. FIG. 13 is an enlarged cross-sectional view taken along a line A-A shown in FIG. 11.

An electronic device EDV6 shown in FIG. 11 includes a semiconductor device 20, a semiconductor device (semiconductor component, electronic component) 60 supplying a power-supply potential to the semiconductor device 20, and a wiring board 10 on which the semiconductor device 20 and the semiconductor device 60 are mounted. The semiconductor device 60 includes an inverter INV which is an electric power conversion circuit. The inverter INV performs processing on an electric power which is externally input, and outputs the electric power on which the processing has been performed. As an example of the foregoing processing, processing of stepping up or down an externally-input potential and outputting a potential different from the input potential is cited. Also, as another example of the foregoing processing, processing of converting input direct-current power supply to alternating-current power supply and outputting it is cited. The semiconductor device 60 is a semiconductor device for power management, which controls an electric power supplied to an electronic component included in the electronic device EDV6.

In FIG. 11, out of a plurality of terminals (leads) 61 included in the semiconductor device 60, a terminal (lead) 61P which is an output terminal from which a processed potential is output is shown. The terminal 61P is electrically connected to the inverter INV within the semiconductor device 60.

A transmission path (electric power transmission path) connected to an output terminal of a power semiconductor device like the semiconductor device 60 allows a larger amount of current to flow therethrough than a signal transmission path described in the above first or second embodiment. For this reason, if noise is included in an electric power transmission path, peripheral circuits of the electric power transmission path are more likely to be electromagnetically affected. Accordingly, in the electronic device EDV6, a noise filter NF3 (see FIG. 12) is connected in an electric power transmission path connected to the terminal 61P which is an output terminal of the semiconductor device 60, so that noise included in the electric power transmission path is reduced.

In an example shown in FIG. 12, like the noise filter NF1 shown in FIG. 2 or the noise filter NF2 shown in FIG. 10, the noise filter NF3 is a low-pass filter including a resistor AR3, an inductor AL3, and a capacitor AC3. Accordingly, in the example shown in FIG. 12, high-frequency noise included in a current flowing through a wire 11P is reduced.

In the case of a low-pass filter, the capacitor AC3 (see FIG. 12) is connected in the vicinity of the semiconductor device 20 which consumes an electric power. For this reason, if a condenser chip which is a chip component is mounted as the capacitor AC3 in the vicinity of the semiconductor device 20, a signal wire (wire connected to the board terminal 12A or the board terminal 12T shown in FIG. 12, for example) connected to the semiconductor device 20 may be electromagnetically affected, in some cases. Thus, in the case of the electronic device EDV6, each of the resistor AR3, the inductor AL3, and the capacitor AC3 which constitute the noise filter NF3 shown in FIG. 12 is formed of a conductor pattern included in the wiring board 10.

As shown in FIG. 11 and FIG. 13, the wiring board 10 includes a board terminal 16P connected to the terminal 61P, and the wire 11P formed in a wiring layer WL1 (see FIG. 13) and connected to the board terminal 16P. Also, the wiring board 10 includes a conductor pattern MPc formed in a wiring layer WL3 (see FIG. 13) different from the wiring layer WL1 and electrically connected to the wire 11P via a via wire VWP, and a conductor pattern MPg formed in a wiring layer WL2 (see FIG. 13) different from the wiring layers WL1 and WL3 and supplied with a fixed potential (ground potential, for example). Also, the conductor pattern MPc and the conductor pattern MPg face each other with an insulating layer 14C (see FIG. 13) interposed therebetween. Also, an area of a region where the conductor pattern MPc and the conductor pattern MPg face each other is larger than an area of the wire 11P. The wire 11P includes an extending portion 11L4 extending in the Y direction, and a via land portion 11VP connected to the via wire VWP. The extending portion 11L4 is located between the via land portion 11VP and the board terminal 16P in plan view.

In the case of the electronic device EDV6, noise in the electric power transmission path can be reduced by connection of the noise filter NF3 in the electric power transmission path. Accordingly, peripheral circuits of the semiconductor device 20 can be prevented from being electromagnetically affected by noise in the electric power transmission path. Also, each of the resistor AR3, the inductor AL3, and the capacitor AC3 which constitute the noise filter NF3 is formed of a conductor pattern included in the wiring board 10. As a result, the peripheral circuits can be prevented from being electromagnetically affected unexpectedly under influence of the noise filter NF3.

Note that, as with the electronic device EDV5 (see FIG. 9) formed in the above second embodiment, the wire 11P constituting a part of the noise filter NF3 (see FIG. 12) included in the electronic device EDV6 bends at a midpoint in a wiring path. The wire 11P includes the extending portion 11L4 extending in the Y direction, and an extending portion 11L5 extending in the X direction crossing the Y direction. The extending portion 11L5 is located between the via land portion 11VP and the board terminal 12P. In the case of a low-pass filter connected to an output terminal, a resistor and an inductor are connected between the output terminal and a capacitor. Values of the resistor AR3 and the inductor AL3 shown in FIG. 12 are determined by a distance over which the extending portion 11L4 extends. Accordingly, as a length of the extending portion 11L4 becomes larger to some extent, it becomes easier to control the values of the resistor AR3 and the inductor AL3. Conversely, in a case where a length of the extending portion 11L5 is large, a risk of being newly mixed with noise after a signal passes through the noise filter NF3 is increased. Accordingly, it is desirable that the length of the extending portion 11L5 is small. Thus, according to the present embodiment, as shown in FIG. 11, the length of the extending portion 11L4 is larger than the length of the extending portion 11L5.

Also the extending portion 11L2 and the extending portion 11L3 shown in FIG. 9 have the same relation between the extending portion 11L4 and the extending portion 11L5 described above.

The electronic device EDV6 shown in FIG. 11 to FIG. 13 is similar to the electronic device EDV5 described with reference to FIG. 9 and FIG. 10 except for the above-described respects. Accordingly, duplicated description will be omitted. Also, respective modification examples described in the above first embodiment may be used in combination to be applied to the electronic device EDV6 of the third embodiment.

Figure 14:
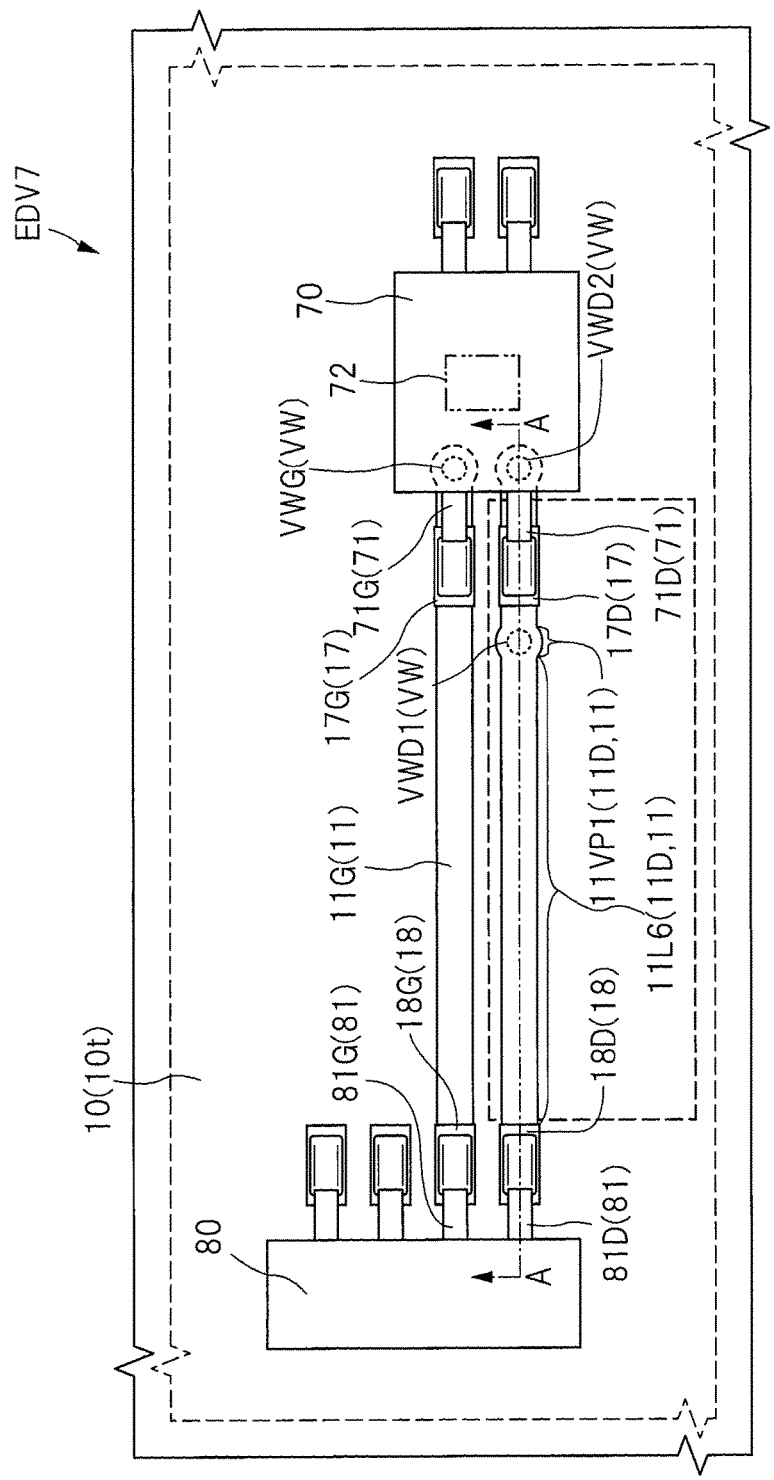
FIG. 14 is an enlarged plan view showing an example of a configuration of an electronic device including a connector and a semiconductor component connected to the connector.
Figure 15:
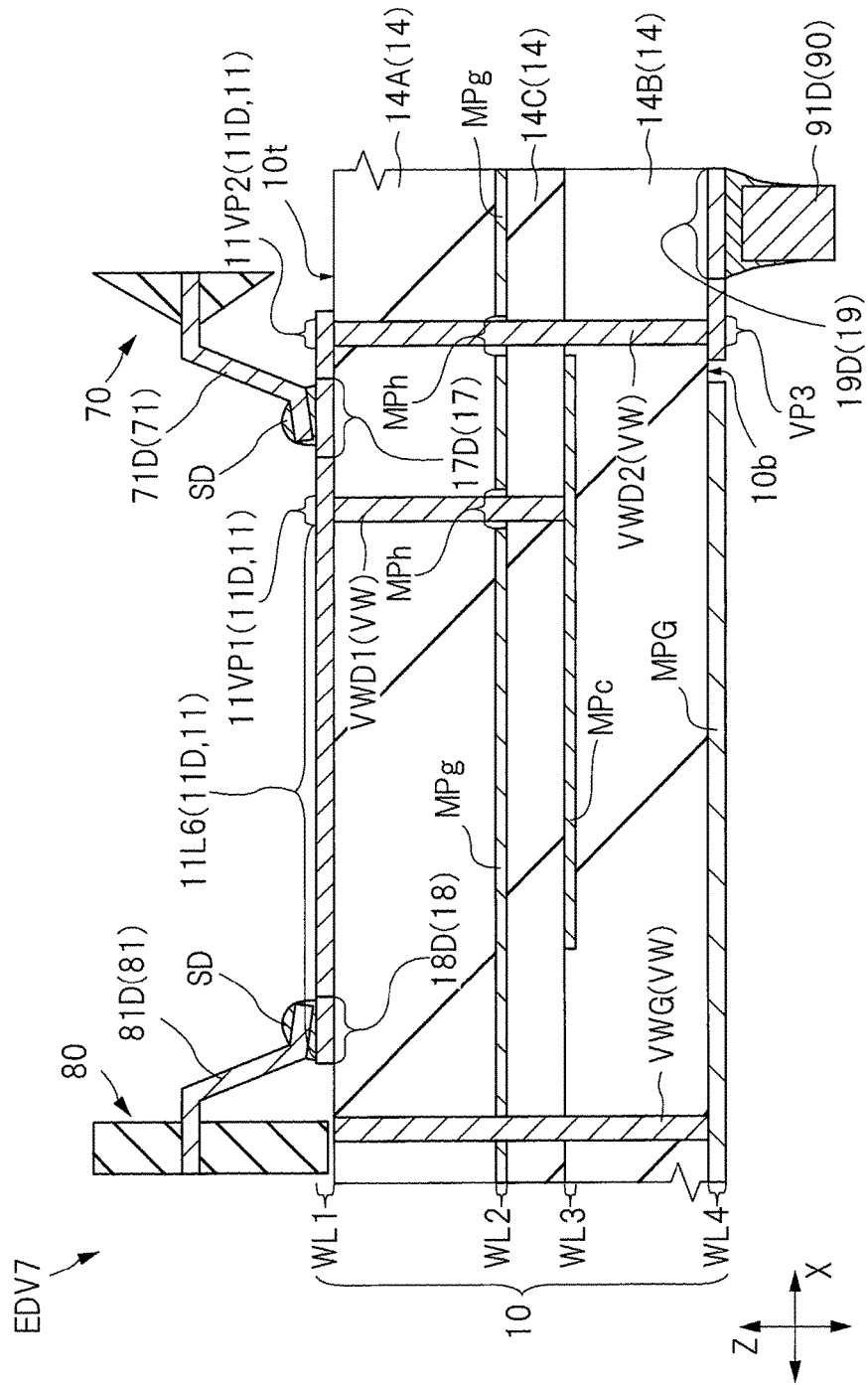
FIG. 15 is an enlarged cross-sectional view taken along a line A-A shown in FIG. 14.
Figure 16:
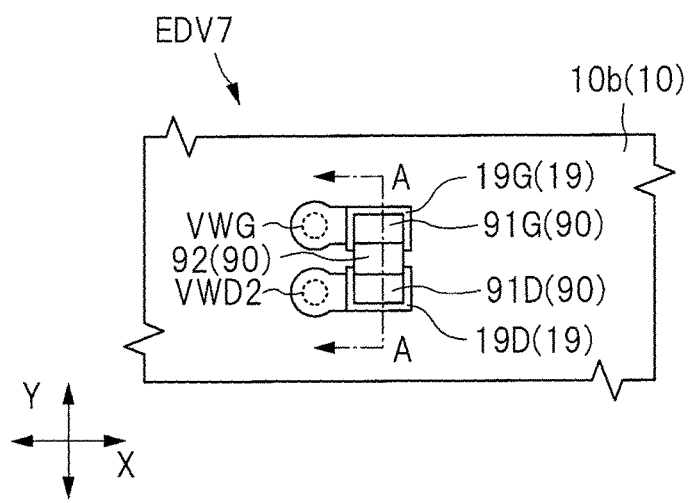
FIG. 16 is an enlarged plan view showing a periphery of a condenser mounted on a lower surface opposite to a surface shown in FIG. 14.
Figure 17:
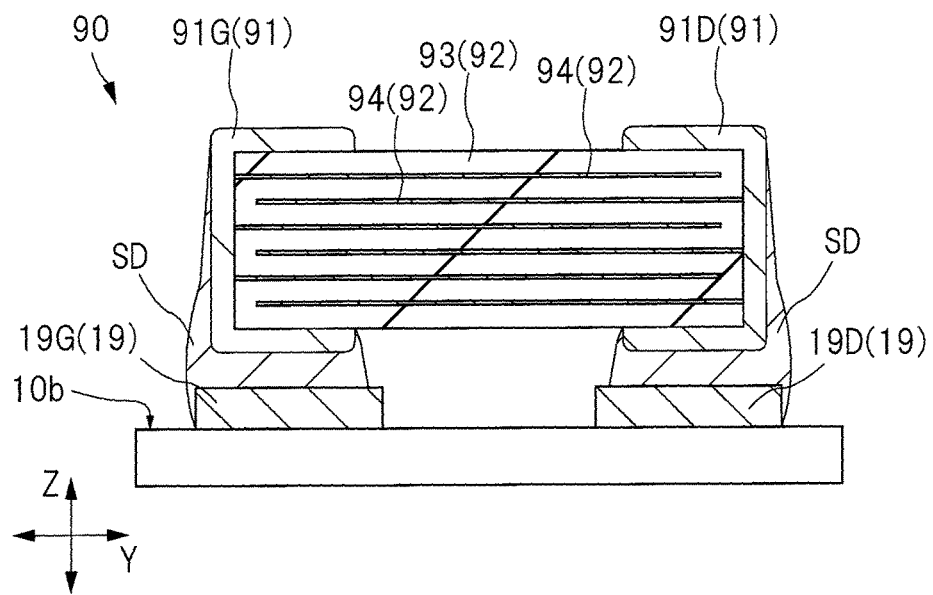
FIG. 17 is an enlarged cross-sectional view taken along a line A-A shown in FIG. 16.
Figure 18:
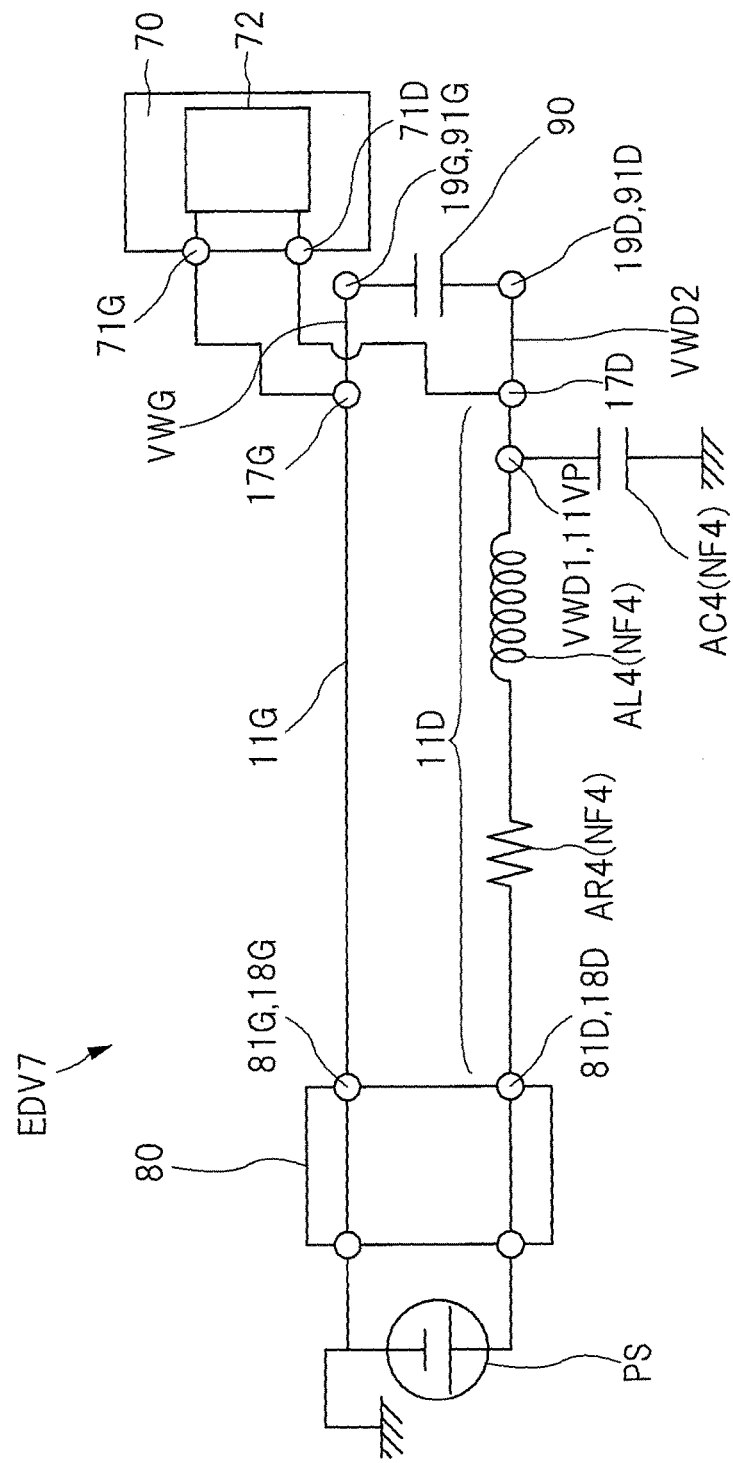
FIG. 18 is a diagram of an equivalent circuit of the electronic device shown in FIG. 14.

Next, in the third embodiment, a mode in which the EMS countermeasure is taken by connection of the noise filter in the electric power transmission path will be described. FIG. 14 is an enlarged plan view showing an example of a configuration of an electronic device including a connector and a semiconductor component connected to the connector. FIG. 15 is an enlarged cross-sectional view taken along a line A-A shown in FIG. 14. FIG. 16 is an enlarged plan view showing a periphery of a condenser mounted on a lower surface opposite to a surface shown in FIG. 14. FIG. 17 is an enlarged cross-sectional view taken along a line A-A shown in FIG. 16. Also, FIG. 18 is a diagram of an equivalent circuit of the electronic device shown in FIG. 14.

An electronic device EDV7 shown in FIG. 14 to FIG. 18 includes a semiconductor device 70 including a circuit 72 (see FIG. 14) to which an electric power is supplied, and a connector 80 relaying an externally-supplied power-supply potential and a ground potential to the semiconductor device 70.

Regarding the circuit 72 included in the semiconductor device (semiconductor component, electronic component) 70, a kind of circuit is not particularly limited so far as the circuit can be supplied with a power-supply potential and a ground potential. For example, the circuit 72 may be a logic circuit performing data processing while consuming an electric power such as an arithmetic processing circuit, a buffer circuit of power supply, or the like. The semiconductor device 70 includes a plurality of terminals (leads) 71 connected to the circuit 72. In FIG. 14, out of the plurality of terminals 71, a terminal (lead) 71D which is an input terminal for a power-supply potential and a terminal (lead) 71G which is an input terminal for a ground potential are shown.

Also, the connector (electronic component) 80 is a relay component (external connection component) which electrically connects the electronic device EDV7 and an external device. FIG. 18 shows an example in which the connector 80 is connected to an external power supply PS. Also, the connector 80 includes a plurality of terminals (leads) 81. In FIG. 14, out of the plurality of terminals 81 included in the connector 80, a terminal (lead) 81D which is an output terminal for a power-supply potential and a terminal (lead) 81G which is an output terminal for a ground potential are shown.

Also, the semiconductor device 70 and the connector 80 are mounted on the wiring board 10 and are electrically connected to each other. The wiring board 10 of the electronic device EDV7 has an upper surface (surface, main surface, front surface) 10t and a lower surface (surface, main surface, back surface) 10b located opposite to the upper surface 10t. Each of the semiconductor device 70 and the connector 80 is mounted on the upper surface 10t. The semiconductor device 70 and the connector 80 are electrically connected to each other via a wire 11 formed in the wiring layer WL1 (see FIG. 15). More specifically, the terminal 71D of the semiconductor device 70 and the terminal 81D of the connector 80, which constitute a supply path for a power-supply potential, are electrically connected to each other via a board terminal 17D, a wire 11D, and a board terminal 18D. Also, the terminal 71G of the semiconductor device 70 and the terminal 81G of the connector 80, which constitute a supply path for a ground potential, are electrically connected to each other via a board terminal 17G, a wire 11G, and a board terminal 18G.

Also, the semiconductor device 70 includes a condenser (condenser component, chip condenser) 90 mounted on the wiring board 10. In an example shown in FIG. 15, the condenser 90 is mounted on the lower surface 10b of the wiring board 10. As shown in FIG. 16, the condenser 90 forms a quadrangular shape in plan view. Also, the condenser 90 has two longer sides (long side surfaces) and two shorter sides (short side surfaces). Also, the condenser 90 includes an electrode 91D and an electrode 91G which are respectively provided in opposite ends. In an example of the present embodiment, two electrodes 91 (see FIG. 17) are respectively located in opposite ends of a direction along which longer sides of the condenser 90 extend. Also, the condenser 90 includes a body 92 interposed between the electrode 91D and the electrode 91G. For example, as shown in FIG. 17, the body 92 includes a plurality of conductor plates 94 which are stacked with an insulating layer (dielectric layer) 93 interposed therebetween, and each of the plurality of conductor plates 94 is connected to one of the electrode 91D and the electrode 91G. The electrode 91D and the electrode 91G function as external electrode terminals used for taking out a capacitance formed among the plurality of conductor plates which are arranged so as to face each other.

The insulating layer 93 made of ceramic is used for the condenser 90 having a configuration shown in FIG. 17, in many cases, and the condenser 90 is referred to as a ceramic condenser. Also, as shown in FIG. 17, the condenser 90 is a surface-mountable electronic component which can be mounted on the front surface of the wiring board 10. A surface-mountable electronic component is also referred to as a chip component (a chip condenser in the case of the condenser 90).

The condenser 90 is connected to a path which supplies a power-supply potential to the semiconductor device 70 and a path which supplies a ground potential to the semiconductor device 70, in parallel. In other words, the condenser 90 (see FIG. 15 to FIG. 18) is connected to paths which supply driving voltages to the semiconductor device 70 in parallel. More specifically, the electrode 91D of the condenser 90 is electrically connected to the board terminal 17D via aboard terminal 19D formed in a wiring layer WL4 (see FIG. 15), a via land portion VP3, a via wire VWD2 passing through the wiring board 10 in the thickness direction, and a via land portion 11VP2. Also, the electrode 91G of the condenser 90 is electrically connected to the board terminal 17G via a board terminal 19G formed in the wiring layer WL4 (see FIG. 15) and a via wire VWG (see FIG. 14, FIG. 16, and FIG. 18) passing through the wiring board 10 in the thickness direction. When the condenser 90 is connected to paths which supply driving voltages to the semiconductor device 70 in parallel, voltage drop or the like can be prevented from occurring due to an instantaneous increase in electric power consumption in the semiconductor device 70. That is, the condenser 90 functions as a bypass condenser. By connecting a bypass condenser in the vicinity of the circuit 72 (see FIG. 18) which consumes an electric power, it is possible to allow the circuit 72 to stably operate, thereby improving reliability of the electronic device EDV7.

Nonetheless, if high-frequency noise is mixed into a driving-voltage supply path, the condenser 90 which is a bypass condenser may not properly operate, in some cases.

In this regard, in the electronic device EDV7, a noise filter NF4 (see FIG. 18) which is a low-pass filter is connected to the path which is supplied with a relatively high power-supply potential, of two transmission paths supplying driving voltages to the semiconductor device 70. As a result, a high-frequency noise can be reduced in a transmission path connected to the wire 11D. Also, the wire 11G is supplied with a ground potential. Accordingly, high-frequency noise is unlikely to be mixed into the transmission path including the wire 11G. Thus, in the case of the electronic device EDV7, by connecting the noise filter NF4 to the wire 11D, high-frequency noise in the path supplying the driving voltage to the semiconductor device 70 is reduced, so that the condenser 90 which is a bypass condenser can be properly operated.

Also, the noise filter NF4 included in the electronic device EDV7 shown in FIG. 18 is formed of a conductor pattern included in the wiring board 10.

As shown in FIG. 14, the wiring board 10 includes the board terminal 18D connected to the terminal 81D, and the wire 11D formed in the wiring layer WL1 (see FIG. 15) and connected to the board terminal 18D. Also, the wiring board 10 includes the conductor pattern MPc formed in the wiring layer WL3 (see FIG. 15) different from the wiring layer WL1 and electrically connected to the wire 11D via a via wire VWD1, and the conductor pattern MPg formed in the wiring layer WL2 (see FIG. 15) different from the wiring layers WL1 and WL3 and supplied with a fixed potential (ground potential, for example). Also, the conductor pattern MPc and the conductor pattern MPg face each other with the insulating layer 14C (see FIG. 15) interposed therebetween. Also, an area of a region where the conductor pattern MPc and the conductor pattern MPg face each other is larger than an area of the wire 11D. The wire 11D includes an extending portion 11L6 which extends in the Y direction, and a via land portion 11VP1 connected to the via wire VWD1. In plan view, the extending portion 11L6 is located between the via land portion 11VP1 and the board terminal 18D, and the via land portion 11VP1 is located between the electrode 91D of the condenser 90 (see FIG. 15) and the extending portion 11L6 of the wire 11D.

Also, each of the conductor pattern MPc and the via wire VWD2 shown in FIG. 15 is connected to the wire 11D. Accordingly, the conductor pattern MPc and the via wire VWD2 can be in contact with each other. However, in an example shown in FIG. 15, the via wire VWD2 is not in contact with the conductor pattern MPc. As a result, a path connected to the noise filter NF4 (see FIG. 18) and a path connected to the condenser 90 which is a bypass condenser can be distinguished from each other using the board terminal 17D as a boundary, so that mutual interference with operations of each other can be prevented. Also, from a viewpoint of preventing interference between the condenser 90 and the noise filter NF4, it is preferable that the conductor pattern MPc and the condenser 90 do not overlap with each other as shown in FIG. 15.

Also, from a viewpoint of shortening the path connected to the condenser 90 which is a bypass condenser, as shown in FIG. 15, it is preferable that a distance of a wiring path connected between the terminal 71D and the via wire VWD2 is approximately equal to or shorter than a distance of a wiring path connected between the terminal 71D and the via wire VWD1.

In the case of the electronic device EDV7, by connection of the noise filter NF4 which is a low-pass filter in an electric power transmission path, a high-frequency noise in the electric power transmission path can be reduced. Accordingly, the bypass condenser 90 is allowed to properly operate. Also, each of a resistor AR4, an inductor AL4, and a capacitor AC4 which constitute the noise filter NF4 is formed of a conductor pattern included in the wiring board 10. As a result, peripheral circuits can be prevented from being electromagnetically affected unexpectedly under influence of the noise filter NF4.

Note that there are various modification examples of the electronic device EDV7 as well. For example, although FIG. 15 shows an example in which the condenser 90 is mounted on the lower surface 10b of the wiring board 10, the condenser 90 may be mounted on the upper surface 10t. In this case, the board terminal 19D connected to the electrode 91D of the condenser 90 is arranged between the board terminal 17D and the via wire VWD1 (via land portion 11VP1) in plan view. In the case of this modification example, a distance of a path between the condenser 90 and the circuit 72 (see FIG. 18) can be made shorter than that in an example shown in FIG. 15. However, when a distance between the chip condenser and the semiconductor device 70 is made shorter, electromagnetic interference between components may occur unexpectedly. Accordingly, from a viewpoint of preventing interference between the components, it is preferable that the condenser 90 is mounted on the lower surface 10b of the wiring board 10 as shown in FIG. 15.

Also, for example, according to the third embodiment, an example in which the condenser 90 which is a ceramic condenser including the electrode 91D and the electrode 91G respectively provided in opposite ends as shown in FIG. 17 is used, is described as an example of a condenser component. However, in a modification example thereof, an electrolytic condenser may be used.

Also, in the same manner as in the electronic device EDV5 (see FIG. 9) formed in the above second embodiment, the wire 11D constituting a part of the noise filter NF4 (see FIG. 18) included in the electronic device EDV7 may bend at a midpoint in a wiring path. In this case, if the wire 11D includes a plurality of extending portions which extend in respective directions crossing each other, it is preferable that the extending portion 11L6 has the largest length.

The electronic device EDV7 shown in FIG. 14 to FIG. 18 are similar to the electronic device EDV5 described with reference to FIG. 9 and FIG. 10 except for the above-described respects. Accordingly, duplicated description will be omitted. Also, respective modification examples described in the above first embodiment may be used in combination to be applied to the electronic device EDV7 of the third embodiment.

Fourth Embodiment

For example, in the above first to third embodiments, a low-pass filter including a resistor, an inductor, and a capacitor has been illustratively described as an example of a noise filter. However, in addition to a low-pass filter which chiefly disturbs passage of high-frequency noise, high-pass filter which chiefly disturbs passage of low-frequency noise, a bandpass filter which disturbs high-frequency noise and low-frequency noise other than noise in a frequency band desired to be passed, and the like are available as a noise filter. In the present embodiment, a mode in which a part of a bandpass filter or a high-pass filter is formed of a conductor pattern of a wiring board will be described as a modification example of the low-pass filter.

Figure 19:
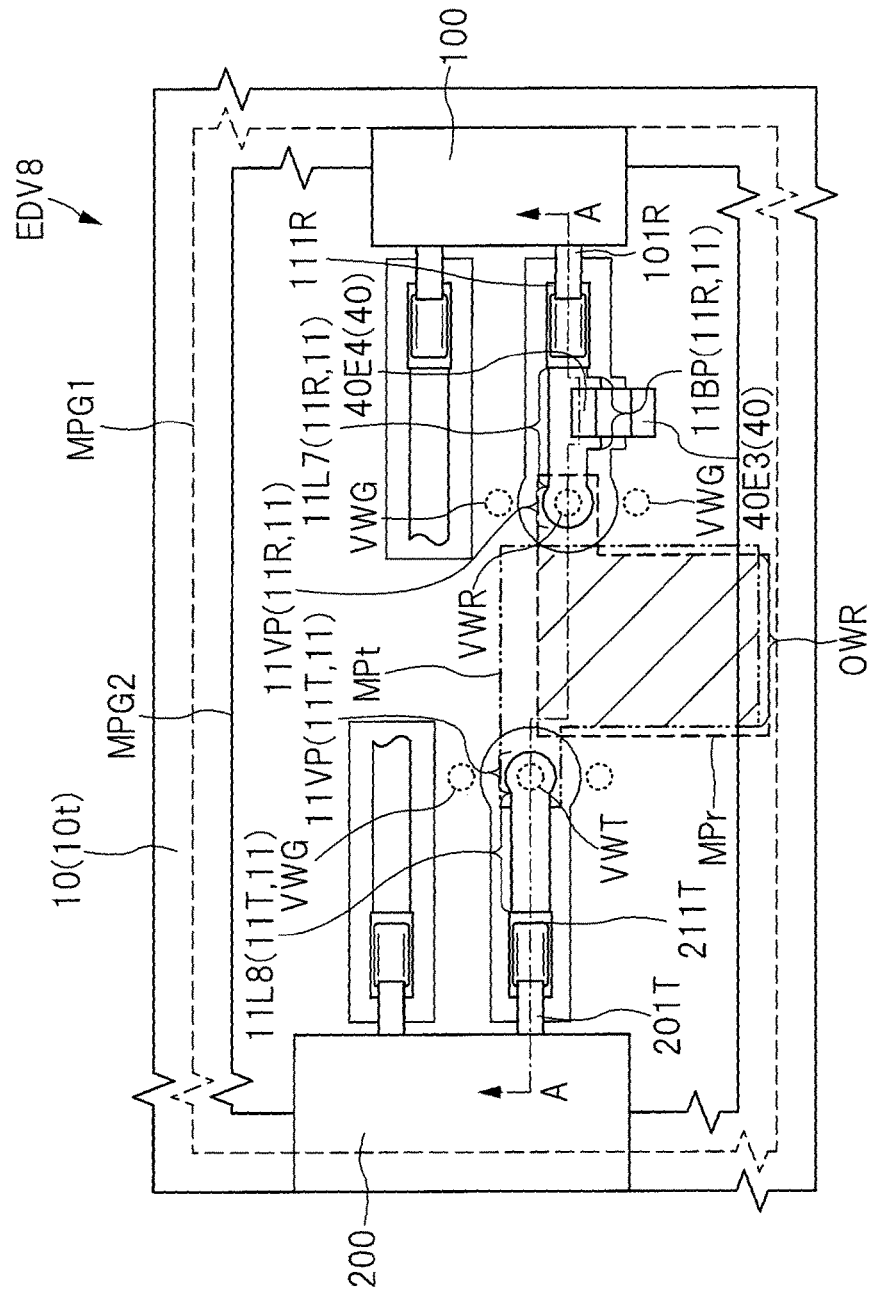
FIG. 19 is an enlarged plan view showing an example of a configuration of an electronic device in which a bandpass filter is connected between a transmitting circuit and a receiving circuit.
Figure 20:
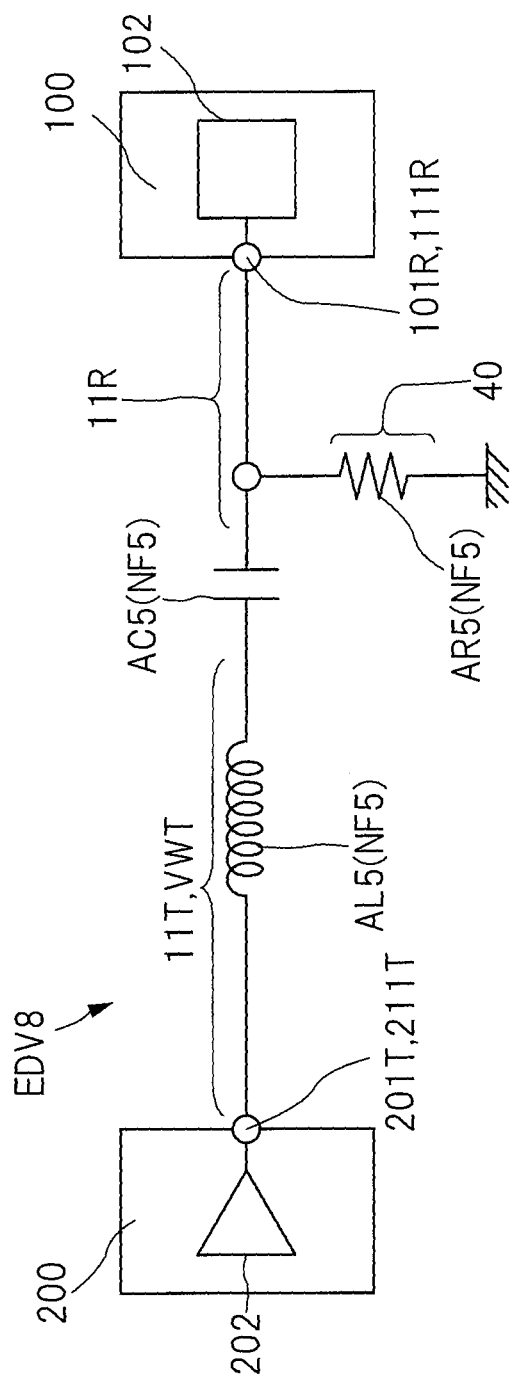
FIG. 20 is a diagram of an equivalent circuit of the electronic device shown in FIG. 19.
Figure 21:
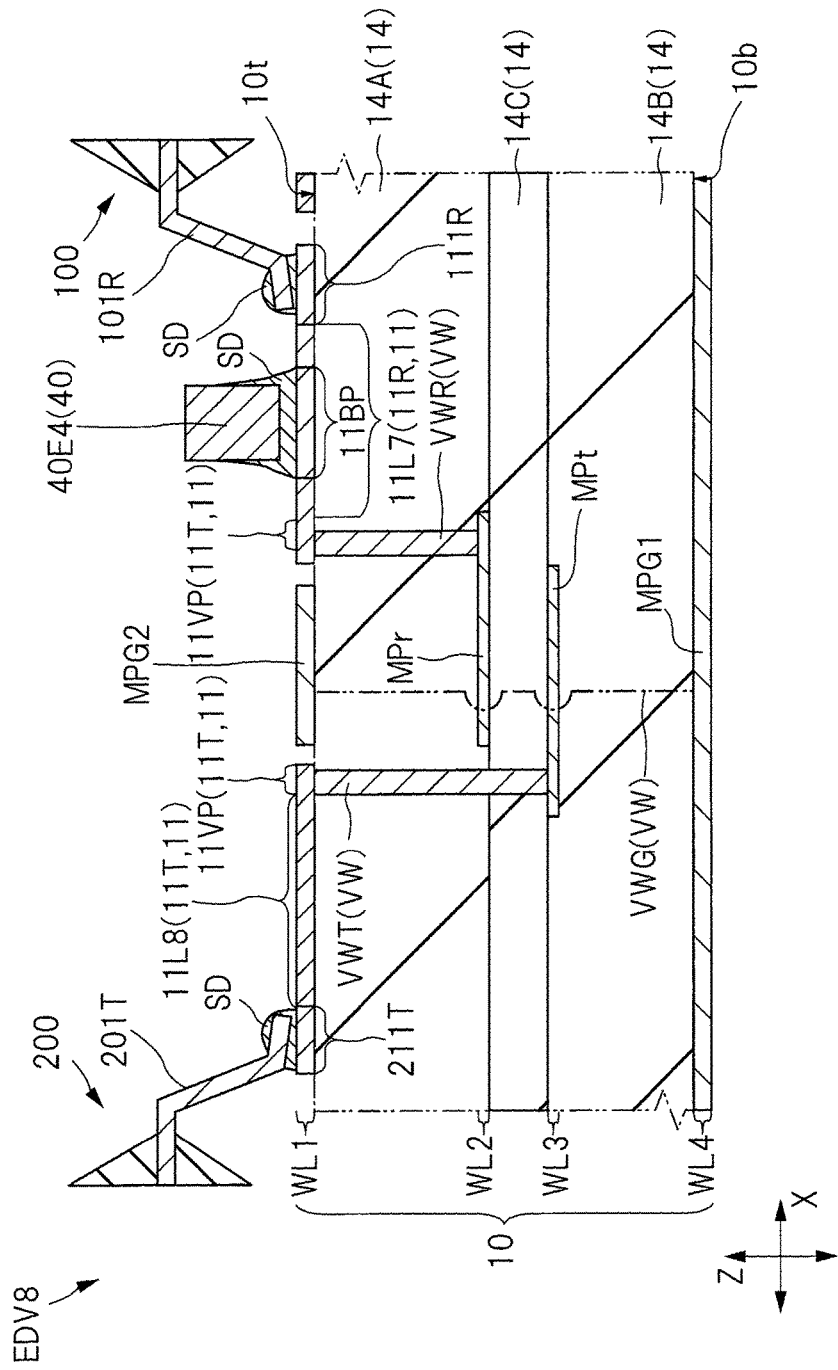
FIG. 21 is an enlarged cross-sectional view taken along a line A-A shown in FIG. 19.

FIG. 19 is an enlarged plan view showing an example of a configuration of an electronic device in which a bandpass filter is connected between a transmitting circuit and a receiving circuit. FIG. 20 is a diagram of an equivalent circuit of the electronic device shown in FIG. 19. FIG. 21 is an enlarged cross-sectional view taken along a line A-A shown in FIG. 19. In FIG. 19, which is a plan view, a region OWR where a conductor pattern MPr and a conductor pattern MPt face each other is hatched. Also, in FIG. 21, a via wire VWG which is present in another cross section and electrically connects a conductor pattern MPG1 and a conductor pattern MPG2 is shown by a two-dot chain line.

The electronic device EDV8 shown in FIG. 19 includes a semiconductor device (semiconductor component, electronic component) 100 including a receiving circuit 102 (see FIG. 20), a semiconductor device (semiconductor component, electronic component) 200 including a transmitting circuit 202 (see FIG. 20), and a wiring board 10 on which the semiconductor devices 100 and 200 are mounted. The electronic device EDV8 includes a high-frequency communication circuit which transmits a high-frequency signal of substantially 5 GHz, for example, between the transmitting circuit 202 and the receiving circuit 102 shown in FIG. 20.

In a case in which a high-frequency signal is transmitted, it is preferable that noise in a frequency band other than a frequency band used for communication is reduced. In this case, by connecting a bandpass filter in a transmission path between the transmitting circuit 202 and the receiving circuit 102, it is possible to reduce noise other than noise in a predetermined frequency band. Also, as described later, noise of a frequency lower than a predetermined frequency band may be reduced by connection of a high-pass filter in the transmission path between the transmitting circuit 202 and the receiving circuit 102, in some cases.

A bandpass filer and a high-pass filter are different from a low-pass filter shown in FIG. 2 and the like in that a capacitor AC5 is serially connected in the transmission path as shown in FIG. 20. One electrode (the conductor pattern MPt shown in FIG. 21) of the capacitor AC5 is connected to the transmitting circuit 202. Also, the other electrode (the conductor pattern MPr shown in FIG. 21) of the capacitor AC5 is connected to the receiving circuit 102.

Also, in the electronic device EDV8, a part of a noise filter NF5 which is a bandpass filter is formed of a conductor pattern of the wiring board 10 (see FIG. 19). More specifically, out of an inductor AL5, the capacitor AC5, and a resistor AR5 which constitute the noise filter NF5 shown in FIG. 20, each of the inductor AL5 and the capacitor AC5 is formed of a conductor pattern of the wiring board 10. Meanwhile, regarding the resistor AR5, a resistance value of a resistor component 40 which is a chip component (chip resistor) serves as a major part of the resistor AR5.

As shown in FIG. 19, the semiconductor device 100 includes a terminal (lead) 101R to which a communication signal is input, and the semiconductor device 200 includes a terminal (lead) 201T from which a communication signal is output. Also, the resistor component 40 includes electrodes 40E3 and 40E4 which are located opposite to each other. Each of the semiconductor devices 100 and 200 and the resistor component 40 is mounted on an upper surface 10t of the wiring board 10.

Also, the wiring board 10 includes a board terminal 111R connected to the terminal 101R of the semiconductor device 100, and a board terminal 211T connected to the terminal 201T of the semiconductor device 200. Also, the wiring board 10 includes a wire 11R electrically connected to the board terminal 111R, and a wire 11T electrically connected to the board terminal 211T. Each of the board terminals 111R and 211T and the wires 11R and 11T is formed in a wiring layer WL1 (see FIG. 21) of the wiring board 10. The wire 11R includes a via land portion 11VP connected to a via wire VWR, and an extending portion 11L7 located between the board terminal 111R and the via land portion 11VP. Also, the wire 11T includes the via land portion 11VP connected to a via wire VWT, and an extending portion 11L8 located between the board terminal 211T and the via land portion 11VP.

Also, the wiring board 10 includes the conductor pattern MPr formed in a wiring layer WL2 (see FIG. 21) different from the wiring layer WL1 and electrically connected to the wire 11R via the via wire VWR, and the conductor pattern MPt formed in a wiring layer WL3 different from the wiring layers WL1 and WL2 and electrically connected to the wire 11T via the via wire VWT. The conductor pattern MPr and the conductor pattern MPt face each other with an insulating layer 14C (see FIG. 21) interposed therebetween. Also, an area of a region OWR where the conductor pattern MPr and the conductor pattern MPt face each other is larger than an area of the wire 11R. Also, the area of the region OWR is larger than an area of the wire 11T. A portion where the conductor pattern MPr and the conductor pattern MPt face each other with the insulating layer 14C interposed therebetween constitutes the capacitor AC5 shown in FIG. 20. Accordingly, the region OWR is located between the via wire VWR and the via wire VWT in plan view.

Also, the wire 11T and the via wire VWT correspond to the inductor AL5 shown in FIG. 20, and it is possible to adjust a value of the inductor AL5 shown in FIG. 20 by adjusting respective lengths of the wire 11T and the via wire VWT.

Also, the wiring board 10 includes the conductor pattern MPG1 formed in a wiring layer WL4 and the conductor pattern MPG2 formed in the wiring layer WL1. Each of the conductor pattern MPG1 and the conductor pattern MPG2 is supplied with a ground potential, and the conductor patterns MPG1 and MPG2 are electrically connected via the via wire VWG.

Also, as shown in FIG. 19, the conductor pattern MPG2 to which a ground potential is supplied is connected to a plurality of via wires VWG. The via wires VWG are arranged at both sides of the via wire VWR and at both sides of the via wire VWT. In other words, the via wire VWR is arranged between the plurality of via wires VWG. Also, the via wire VWT is arranged between the plurality of via wires VWG. In this manner, by arranging the via wires VWG to which a ground potential is supplied at both sides of each of the via wire VWR and the via wire VWT which are signal transmission paths, it is possible to reduce electromagnetic influence of other circuits upon signal transmission paths of the via wire VWR and the via wire VWT.

Also, the wire 11R is connected to the electrode 40E4 which is one electrode of the resistor component 40. More specifically, the wire 11R includes the via land portion 11VP connected to the via wire VWR, and a resistor connection portion 11BP connected to the electrode 40E4 of the resistor component 40. The resistor connection portion 11BP is located between the board terminal 111R and the via land portion 11VP. The extending portion 11L7 extending in the X direction is located between the board terminal 111R and the via land portion 11VP, and the resistor connection portion 11BP is located at a midpoint in the extending portion 11L7. The electrode 40E4 is bonded to and electrically connected with the resistor connection portion 11BP via a solder SD. The resistor connection portion 11BP is located between the board terminal 111R and the via wire VWR (via land portion 11VP) in plan view. Also, the electrode 40E3 which is the other electrode of the resistor component 40 is connected to the conductor pattern MPG2.

In the case of the electronic device EDV8, out of the inductor AL5, the capacitor AC5, and the resistor AR5 which constitute the noise filter NF5 shown in FIG. 20, each of the inductor AL5 and the capacitor AC5 is formed of a conductor pattern of the wiring board 10. Accordingly, the inductor AL5 and the capacitor AC5 can be prevented from electromagnetically interfering with other electronic components. Also, in the case of the electronic device EDV8, a chip component is used for the resistor AR5. However, a resistance value of the resistor AR5 constituting a part of a bandpass filter is several tens of ohms or higher, for example, so that a small current flows therethrough. Accordingly, even if a chip component is used for the resistor AR5, electromagnetic influence is less significant than that in a case where the resistor AR5 is incorporated in a low-pass filter. Also, in a case in which a resistive element with high resistance is formed of a conductor pattern, a distance over which the conductor pattern extends should be made long, so that a planar area of the wiring board 10 might be increased. Thus, in the case of the electronic device EDV8, a chip component is used for the resistor AR5, so that a planar area of the wiring board 10 is reduced.

Figure 22:
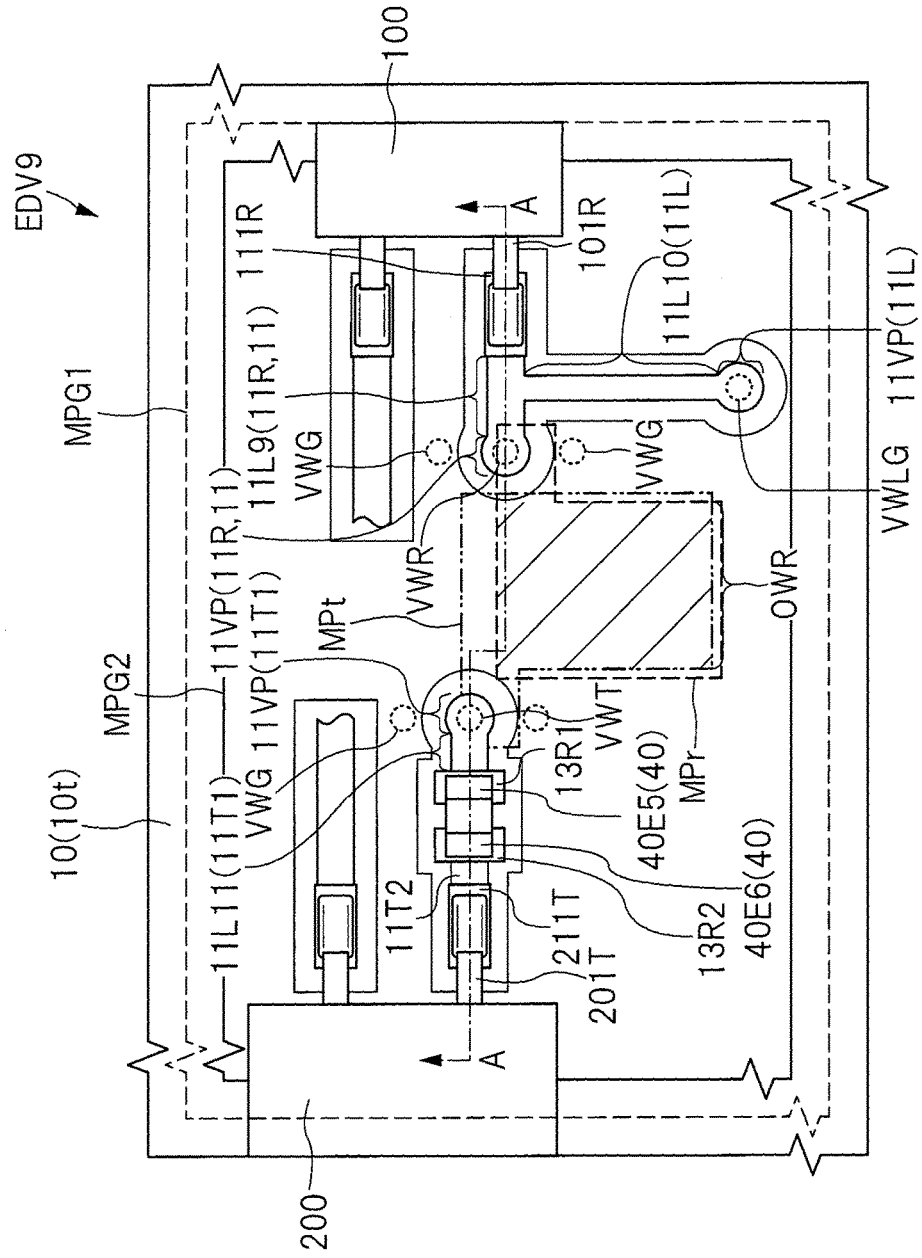
FIG. 22 is an enlarged plan view showing an example of a configuration of an electronic device in which a high-pass filter is connected between a transmitting circuit and a receiving circuit.
Figure 23:
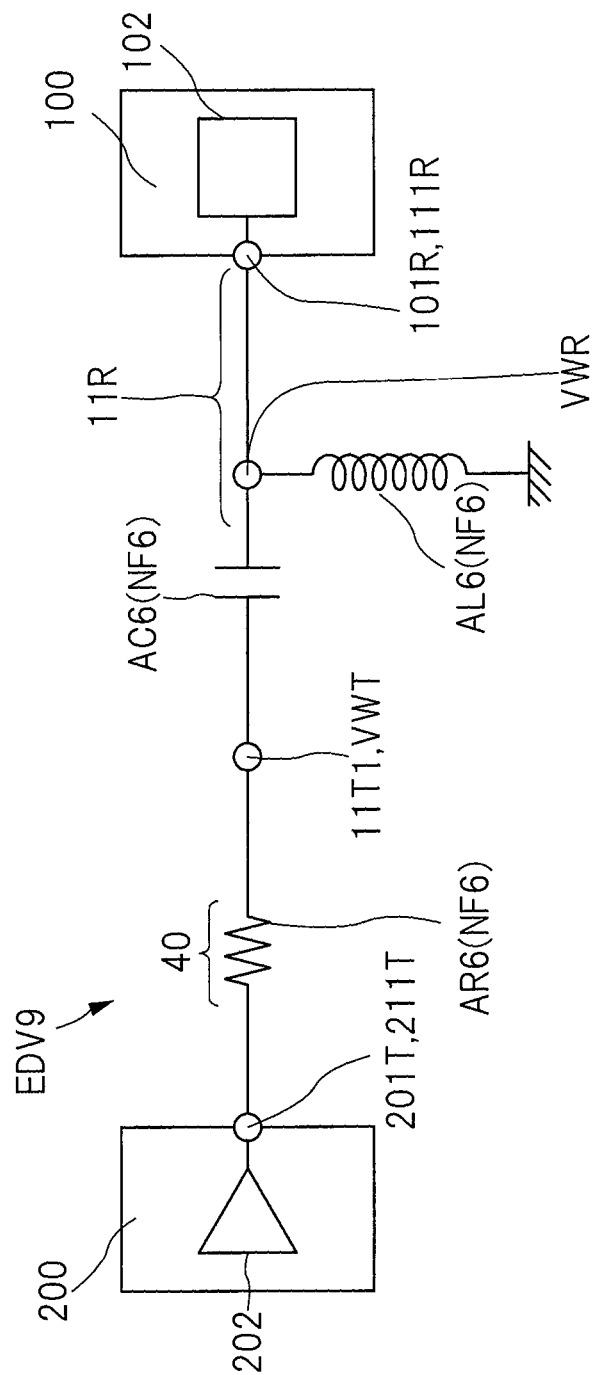
FIG. 23 is a diagram of an equivalent circuit of the electronic device shown in FIG. 22.
Figure 24:
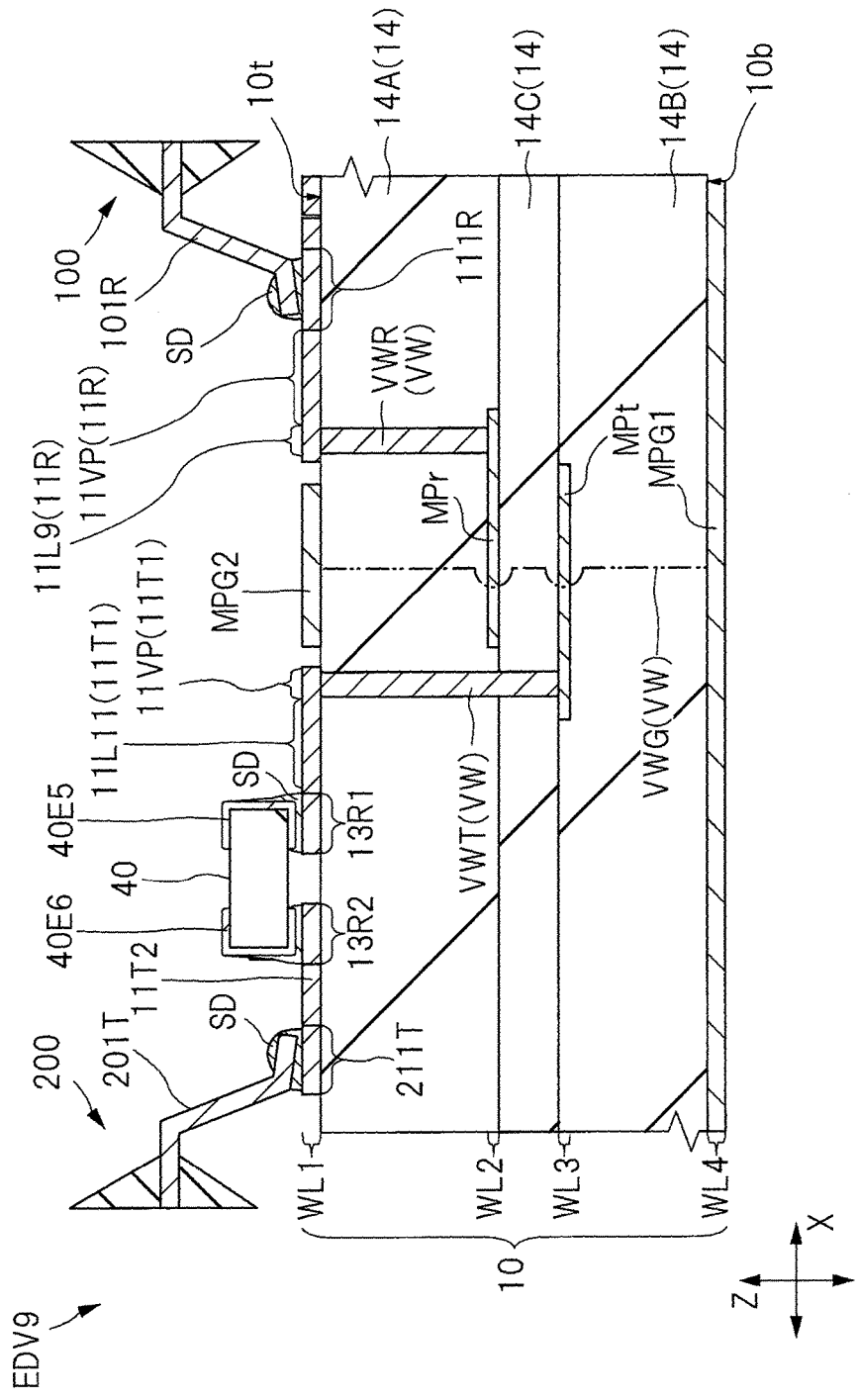
FIG. 24 is an enlarged cross-sectional view taken along a line A-A shown in FIG. 22.

Next, an example of a configuration of an electronic device including a high-pass filter will be described. FIG. 22 is an enlarged plan view showing an example of a configuration of an electronic device in which a high-pass filter is connected between a transmitting circuit and a receiving circuit. FIG. 23 is a diagram of an equivalent circuit of the electronic device shown in FIG. 22. FIG. 24 is an enlarged cross-sectional view taken along a line A-A shown in FIG. 22. In FIG. 22, which is a plan view, the region OWR where the conductor pattern MPr and the conductor pattern MPt face each other is hatched. Also, in FIG. 24, the via wire VWG which is present in another cross section and electrically connects the conductor pattern MPG1 and the conductor pattern MPG2 is shown by a two-dot chain line.

Duplicated description about parts of an electronic device EDV9 shown in FIG. 22 to FIG. 24, which are similar to those in the electronic device EDV8 described with reference to FIG. 19 to FIG. 21, such as the semiconductor device 100 or the semiconductor device 200, will be omitted.

A high-pass filter is also different from a low-pass filter shown in FIG. 2 and the like in that a capacitor AC6 is serially connected in a transmission path as shown in FIG. 23. One electrode (the conductor pattern MPt shown in FIG. 24) of the capacitor AC6 is connected to the transmitting circuit 202. Also, the other electrode (the conductor pattern MPr shown in FIG. 24) of the capacitor AC6 is connected to the receiving circuit 102.

Also, in the electronic device EDV9, a part of a noise filter NF6 which is a high-pass filter is formed of a conductor pattern of a wiring board 10 (see FIG. 22). More specifically, out of an inductor AL6, the capacitor AC6, and a resistor AR6 which constitute the noise filter NF6 shown in FIG. 23, each of the inductor AL6 and the capacitor AC6 is formed of a conductor pattern of the wiring board 10. Meanwhile, regarding the resistor AR6, a resistance value of a resistor component 40 which is a chip component (chip resistor) serves as a major part of the resistor AR6.

As shown in FIG. 22, the semiconductor device 100 includes the terminal (lead) 101R to which a communication signal is input, and the semiconductor device 200 includes the terminal (lead) 201T from which a communication signal is output. Also, the resistor component 40 includes electrodes 40E5 and 40E6 which are located opposite to each other. Each of the semiconductor devices 100 and 200 and the resistor component 40 is mounted on the upper surface 10t of the wiring board 10.

Also, the wiring board 10 includes the board terminal 111R connected to the terminal 101R of the semiconductor device 100, and the board terminal 211T connected to the terminal 201T of the semiconductor device 200. Also, the wiring board 10 of the electronic device EDV9 includes a board terminal 13R1 connected to the electrode 40E5 of the resistor component 40, and a board terminal 13R2 connected to the electrode 40E6 of the resistor component 40. Also, the wiring board 10 includes the wire 11R electrically connected to the board terminal 111R, and a wire 11T2 electrically connected to the board terminal 211T. Also, the wiring board 10 of the electronic device EDV9 includes a wire 11T1 connected to the board terminal 13R1, and a wire 11L connected to the wire 11R. Each of the board terminals 111R, 211T, 13R1, and 13R2 and the wires 11R, 11T1, 11T2, and 11L is formed in the wiring layer WL1 (see FIG. 24) of the wiring board 10.

Also, the wiring board 10 includes the conductor pattern MPr formed in the wiring layer WL2 (see FIG. 24) different from the wiring layer WL1 and electrically connected to the wire 11R via the via wire VWR, and the conductor pattern MPt formed in the wiring layer WL3 different from the wiring layers WL1 and WL2 and electrically connected to the wire 11T1 via the via wire VWT. The conductor pattern MPr and the conductor pattern MPt face each other with the insulating layer 14C (see FIG. 24) interposed therebetween. Also, an area of the region OWR where the conductor pattern MPr and the conductor pattern MPt face each other is larger than an area of the wire 11R. Also, the area of the region OWR is larger than an area of the wire 11T1. A portion where the conductor pattern MPr and the conductor pattern MPt face each other with the insulating layer 14C interposed therebetween constitutes the capacitor AC6 shown in FIG. 23. Accordingly, the region OWR is located between the via wire VWR and the via wire VWT in plan view.

Also, the wire 11L connected to the wire 11R and a via wire VWLG connected to the wire 11L correspond to the inductor AL6 shown in FIG. 23. The wire 11R includes an extending portion 11L9 extending in the X direction, and the via land portion 11VP connected to the via wire VWR. In plan view, the wire 11L includes an extending portion 11L10 which is connected between the board terminal 111R and the via land portion 11VP of the wire 11R and is longer than the extending portion 11L9. Also, the via wire VWLG, like the via wire VWG shown in FIG. 24, is an interlayer conducting path passing through the wiring board 10 in the thickness direction and is electrically connected to the conductor pattern MPG1 to which a ground potential is supplied, in the wiring layer WL4. In the case of the noise filter NF6 (see FIG. 23), it is possible to adjust a value of the inductor AL6 shown in FIG. 23 by adjusting a length of the extending portion 11L10 of the wire 11L shown in FIG. 22.

Also, the wiring board 10 includes the conductor pattern MPG1 formed in the wiring layer WL4, and the conductor pattern MPG2 formed in the wiring layer WL1. Each of the conductor pattern MPG1 and the conductor pattern MPG2 is supplied with a ground potential, and the conductor patterns MPG1 and MPG2 are electrically connected via the via wire VWG.

Also, as shown in FIG. 22, the conductor pattern MPG2 to which a ground potential is supplied is connected to the plurality of via wires VWG. The via wires VWG are arranged at both sides of the via wire VWR and at both sides of the via wire VWT. In other words, the via wire VWR is arranged between the plurality of via wires VWG. Also, the via wire VWT is arranged between the plurality of the via wires VWG. In this manner, by arranging the via wires VWG to which a ground potential is supplied at both sides of each of the via wire VWR and the via wire VWT which are signal transmission paths, it is possible to reduce electromagnetic influence of other circuits upon the signal transmission paths of the via wire VWR and the via wire VWT.

Also, the resistor AR6 constituting the high-pass filter shown in FIG. 23 should have a resistance value of several tens of ohms or higher, for example. For this reason, from a viewpoint of reducing a planar area of the wiring board 10, the resistor component 40 which is a chip component is used as the resistor AR6 in the electronic device EDV9.

In the resistor component 40, the electrode 40E5 and the electrode 40E6 are mounted on the board terminal 13R1 and the board terminal 13R2, respectively, via the solder SD (see FIG. 24). The board terminal 13R1 of the wiring board 10 is electrically connected to the via wire VWT via the wire 11T1. The wire 11T1 includes the via land portion 11VP connected to the via wire VWT, and an extending portion 11L11 located between the via land portion 11VP and the board terminal 13R1. Also, the board terminal 13R2 of the wiring board 10 is electrically connected to the board terminal 211T via the wire 11T2.

In the present embodiment, one mode in which a part of a bandpass filter is formed of a conductor pattern of a wiring board, and one mode in which a part of a high-pass filer is formed of a conductor pattern of a wiring board, have been illustratively described as modification examples of a low-pass filter. However, there are various modification examples of the electronic device EDV8 shown in FIG. 19 and the electronic device EDV9 shown in FIG. 22.

For example, with reference to FIG. 21 and FIG. 24, an example in which the conductor pattern MPr is formed in the wiring layer WL2 and the conductor pattern MPt is formed in the wiring layer WL3 has been described. However, wiring layers in which those conductive patterns are formed are not limited to the above-described wiring layers so far as there can be provided a configuration in which the conductor pattern MPr and the conductor pattern MPt face each other with an insulating layer interposed therebetween. For example, the conductor pattern MPt and the conductor pattern MPr may be formed in the wiring layer WL2 and the wiring layer WL3, respectively.

Also, for example, although the electronic devices EDV8 and EDV9 each including both of the transmitting circuit 202 and the receiving circuit 102 as shown in FIG. 20 and FIG. 23 have been described in the present embodiment, an electronic device may include one of the transmitting circuit and the receiving circuit. In this case, it will be sufficient if either the semiconductor device 200 including the transmitting circuit 202 or the semiconductor device 100 including the receiving circuit 102 serves as a relay component (electronic component) such as the connector 80 shown in FIG. 14, for example. The relay component has a function of receiving a signal output from the transmitting circuit 202 from an external device, or transmitting a signal input to the receiving circuit 102 to an external device.

Further, the plurality of modification examples described in the above first to third embodiments may be used in combination to be applied.

Other Modification Examples

In the foregoing, the invention made by the inventor of the present invention has been concretely described based on the embodiments. However, it is needless to say that the present invention is not limited to the foregoing embodiments and various modification examples and alterations can be made within the scope of the present invention. Note that, while some modification examples have been described in the above embodiments, typical modification examples other than the modification examples described in the above embodiments will be described below.

For example, in the above first to fourth embodiments, as an example of a configuration of a conductor pattern constituting a capacitor, a configuration in which a single conductor pattern MPc and a single conductor pattern MPg face each other with the insulating layer 14C interposed therebetween as shown in FIG. 3, for example, has been described. In this case, a capacitor can be constituted by the wiring layer WL2 and the wiring layer WL3 which are different from the wiring layer WL1 as shown in FIG. 3, so that the number of wiring layers in the wiring board 10 can be reduced.

Figure 25:
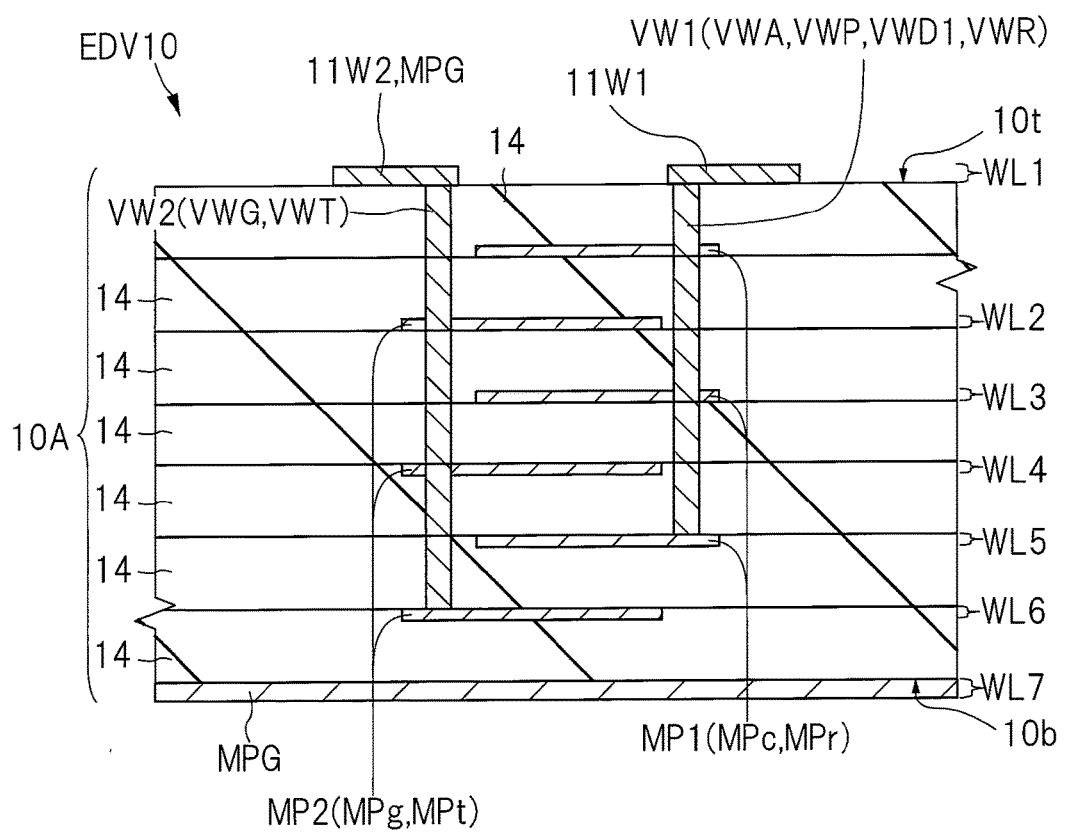
FIG. 25 is an enlarged cross-sectional view showing a modification example of a capacitor described with reference to FIG. 1 to FIG. 24.

However, the number of wiring layers in the wiring board 10 may be four or more. For example, a wiring board 10A included in an electronic device EDV10 shown in FIG. 25 includes seven wiring layers of wiring layers WL1 to WL7. FIG. 25 is an enlarged cross-sectional view showing a modification example of the capacitor described with reference to FIG. 1 to FIG. 24. A modification example in which the number of wiring layers is large will be described below, taking the electronic device EDV10 as an example.

In the case of the electronic device EDV10, since the number of wiring layers is large, conductor patterns MP1 and MP2 constituting a capacitor can be arranged in a large number of wiring layers. The electronic device EDV10 is different from the electronic devices EDV1 to EDV9 described in the above first to third embodiments in that a plurality of the conductor patterns MP1 and a plurality of the conductor patterns MP2 are stacked such that each conductor pattern MP1 and each conductor pattern MP2 constitute a capacitor. More specifically, a configuration of the wiring board 10A can be represented as follows.

The wiring board 10A includes the plurality of conductor patterns MP1 connected to a wire 11W1 via a via wire VW1 and formed in different wiring layers from one another. Also, the wiring board 10A includes the plurality of conductor patterns MP2 connected to a wire 11W2 or a conductor pattern MPG via a via wire VW2 and formed in different wiring layers from one another. Each of the plurality of conductor patterns MP1 and each of the plurality of conductor patterns MP2 are formed in different wiring layers. Also, each of the plurality of conductor patterns MP1 faces any of the plurality of conductor patterns MP2 with an insulating layer 14 interposed therebetween.

The plurality of conductor patterns MP1 are electrically connected to one another via the via wire VW1. Also, the plurality of conductor patterns MP2 are electrically connected to one another via the via wire VW2. Thus, in a case in which the plurality of conductor patterns MP1 and the plurality of conductor patterns MP2 are stacked, a capacitance value of a capacitor can be increased even though an area of each of the conductor patterns MP1 and MP2 is small. For this reason, in a case where a capacitor having a stacked configuration is included like the electronic device EDV10, as compared to a case in which a single conductor pattern MP1 and a single conductor pattern MP2 are provided, an area occupied by the capacitor can be reduced in plan view. As a result, a planar area of the wiring board 10A can be reduced.

Note that the capacitor included in the electronic device EDV10 can be applied by being replaced with a capacitor included in each of the electronic devices EDV1 to EDV9 described in the above embodiments. Accordingly, the conductor pattern MP1 corresponds to the conductor pattern MPc or MPr described in the above embodiments. Also, the conductor pattern MP2 corresponds to the conductor pattern MPg or MPt described in the above embodiments. Also, the via wire VW1 corresponds to the via wire VWA, VWP, VWD1, or VWR described in the above embodiments. Also, the via wire VW2 corresponds to the via wire VWG or VWT described in the above embodiments.

Also, in the above first to third embodiments, a mode in which a major part of the wire 11 connected to the conductor pattern MPc overlaps with the conductor pattern MPc in plan view has been described. However, a major part of the wire 11 connected to the conductor pattern MPr is not necessarily required to overlap with the conductor pattern MPr in plan view, like the example shown in FIG. 19.

Also, in the above embodiments, an example in which each of the plurality of board terminals 12 and 13 and the wire 11 is formed in the wiring layer WL1 as shown in FIG. 3, for example, has been described. However, the wire 11 may be formed in a lower layer than the board terminal (in a wiring layer closer to a lower surface 10b side).

Also, in the above embodiments, a configuration in which a single noise filter is included has been described. However, a noise filter may be connected to each of a plurality of transmission paths like the electronic device EDV4 described with reference to FIG. 8. Also, in a case where a plurality of circuits (amplifier circuits, for example) operating with multi-channels are provided, for example, a noise filter may be connected to each of respective transmission paths of the plurality of circuits. In this case, a plurality of conductor patterns MPc may be formed in a plurality of wiring layers, depending on a layout.

In addition, various modification examples have been described above, for example, and it is possible to apply the above-described modification examples in combination.

Also, when a technical idea about the electronic devices described in the above embodiments is extracted, the following representation can be made.

First Supplementary Note

An electronic device including:
an electronic component including a first terminal to which a first signal is input;
a wiring board on which the electronic component is mounted; and
a resistor component which is mounted on the wiring board and includes two electrodes located opposite to each other,
in which the wiring board includes:
a first board terminal connected to the first terminal;
a second board terminal;
a first wire which is formed in a first wiring layer and is electrically connected to the first board terminal;
a second wire which is formed in the first wiring layer and is electrically connected to the second board terminal;
a first conductor pattern which is formed in a second wiring layer different from the first wiring layer and is electrically connected to the first wire via a first via wire; and
a second conductor pattern which is formed in a third wiring layer different from the first wiring layer and the second wiring layer and is electrically connected to the second wire via a second via wire,
the first conductor pattern and the second conductor pattern face each other with an insulating layer interposed therebetween,
an area of a first region where the first conductor pattern and the second conductor pattern face each other is larger than an area of the first wire,
the first wire includes a first via land portion connected to the first via wire, and a resistor connection portion connected to one of the two electrodes of the resistor component, and
in plan view, the resistor connection portion is located between the first board terminal and the first via wire, and the first region is located between the first via wire and the second via wire.

Second Supplementary Note

An electronic device including:
an electronic component including a first terminal to which a first signal is input;
a wiring board on which the electronic component is mounted; and
a resistor component which is mounted on the wiring board and includes a first electrode and a second electrode located opposite to each other,
in which the wiring board includes:
a first board terminal connected to the first terminal;
a second board terminal connected to the first electrode of the resistor component;
a third board terminal connected to the second electrode of the resistor component;
a first wire which is formed in a first wiring layer and is electrically connected to the first board terminal;
a second wire which is formed in the first wiring layer and is electrically connected to the second board terminal;
a third wire which is formed in the first wiring layer and is connected to the first wire;
a first conductor pattern which is formed in a second wiring layer different from the first wiring layer and is electrically connected to the first wire via a first via wire; and
a second conductor pattern which is formed in a third wiring layer different from the first wiring layer and the second wiring layer and is electrically connected to the second wire via a second via wire, the first conductor pattern and the second conductor pattern face each other with an insulating layer interposed therebetween, an area of a first region where the first conductor pattern and the second conductor pattern face each other is larger than an area of the first wire, the first wire includes a first extending portion extending in a first direction, and a first via land portion connected to the first via wire, in plan view, the third wire includes a second extending portion which is connected between the first board terminal and the first via land portion and is longer than first extending portion, and in plan view, the second via wire is located between the first region and the second board terminal, and the first region is located between the first via wire and the second via wire.

What is claimed is:

1. An electronic device comprising:
a semiconductor component including a first terminal to or from which a first signal is input or output; and
a wiring board including an upper surface, on which the semiconductor component is mounted such that the upper surface faces the semiconductor component, and a lower surface opposite the upper surface,
wherein the wiring board includes:
  a first board terminal which is formed in a first wiring layer and is electrically connected to the first terminal;
  a first wire which is formed in the first wiring layer and is electrically connected to the first board terminal;
  a first conductor pattern which is formed in a second wiring layer different from the first wiring layer and is electrically connected to the first wire via a first via wire; and
  a second conductor pattern which is formed in a third wiring layer different from the first wiring layer and the second wiring layer and is supplied with a first fixed potential,
wherein the first wiring layer is located closer to the upper surface than the lower surface in a cross-sectional view,
wherein the second wiring layer is located between the first wiring layer and the lower surface in the cross-sectional view,
wherein the first conductor pattern and the second conductor pattern face each other with an insulating layer interposed therebetween, and
wherein an area of a region where the first conductor pattern and the second conductor pattern face each other is larger than an area of the first wire in a plan view.

2. The electronic device according to claim 1,
wherein, in a thickness direction of the wiring board, the third wiring layer is located between the second wiring layer and the first wiring layer in the cross-sectional view.

3. The electronic device according to claim 2,
wherein the semiconductor component includes a second terminal through which a current different from the first signal flows,
wherein the wiring board includes a second board terminal which is formed in the same layer where the first board terminal is formed and which is connected to the second terminal, and
wherein, in the plan view, the first conductor pattern overlaps with the second board terminal.

4. The electronic device according to claim 2,
wherein the first wire and the second conductor pattern face each other with an insulating layer interposed therebetween.

5. The electronic device according to claim 1,
wherein the first wire includes a first extending portion extending in a first direction, and a first via land portion connected to the first via wire, and
wherein, in the plan view, the first conductor pattern overlaps with the first extending portion of the first wire.

6. The electronic device according to claim 1,
wherein the first signal is an input signal input to a first circuit of the semiconductor component via the first terminal,
wherein the first wire includes a first extending portion extending in a first direction, and a first via land portion connected to the first via wire,
wherein the first via land portion is located between the first extending portion and the first board terminal in the plan view, and
wherein, in the plan view, a separation distance between the first board terminal and the first via land portion is shorter than a distance over which the first extending portion extends.

7. The electronic device according to claim 1,
wherein an electronic component connected to the first wire is mounted on the wiring board,
wherein the first signal is a signal which is output from the electronic component and is input to a first circuit of the semiconductor component via the first terminal,
wherein the first wire includes a first extending portion extending in a first direction, and a first via land portion connected to the first via wire,
wherein the first via land portion is located between the first extending portion and the first board terminal in the plan view, and
wherein, in the plan view, a separation distance between the electronic component and the first via land portion is longer than a separation distance between the first board terminal and the first via land portion.

8. The electronic device according to claim 1,
wherein the first signal is an output signal output from a first circuit of the semiconductor component via the first terminal,
wherein the first wire includes a first extending portion extending in a first direction, and a first via land portion connected to the first via wire, and
wherein the first extending portion is located between the first via land portion and the first board terminal in the plan view.

9. The electronic device according to claim 1,
wherein an electronic component connected to the first wire is mounted on the wiring board,
wherein the first signal is a signal which is output from a first circuit of the semiconductor component via the first terminal and is input to the electronic component,
wherein the first wire includes a first extending portion extending in a first direction, and a first via land portion connected to the first via wire,
wherein the first extending portion is located between the first via land portion and the first board terminal in the plan view, and
wherein, in the plan view, a separation distance between the first terminal and the first via land portion is longer than a separation distance between the electronic component and the first via land portion.

10. The electronic device according to claim 1,
wherein the first wire includes a first extending portion extending in a first direction,
wherein, in the plan view, the first conductor pattern has a first longer side extending in the first direction, and a second longer side located opposite to the first longer side, and
wherein, in a second direction crossing the first direction, a separation distance between the first longer side and the second longer side is longer than a width of the first extending portion of the first wire.

11. The electronic device according to claim 10,
wherein a length of the first extending portion of the first wire in the first direction is longer than the separation distance between the first longer side and the second longer side.

12. The electronic device according to claim 1,
wherein the wiring board includes:
  a plurality of the first conductor patterns connected to the first wire via the first via wire and formed in different wiring layers from one another; and
  a plurality of the second conductor patterns formed in different wiring layers from one another,
wherein each of the plurality of the first conductor patterns and each of the plurality of the second conductor patterns are formed in different wiring layers with each other, and
wherein each of the plurality of the first conductor patterns faces any of the plurality of the second conductor patterns with the insulating layer interposed therebetween.

13. An electronic device comprising:
a semiconductor component including an electric power conversion circuit, and a first terminal which is an output terminal connected to the electric power conversion circuit; and
a wiring board including an upper surface on which the semiconductor component is mounted such that the upper surface faces the semiconductor component, and a lower surface opposite the upper surface,
wherein the wiring board includes:
  a first board terminal which is formed in a first wiring layer and is electrically connected to the first terminal;
  a first wire formed in the first wiring layer and electrically connected to the first board terminal;
  a first conductor pattern formed in a second wiring layer different from the first wiring layer and electrically connected to the first wire via a first via wire; and
  a second conductor pattern formed in a third wiring layer different from the first wiring layer and the second wiring layer and supplied with a first fixed potential,
wherein the first wiring layer is located closer to the upper surface than the lower surface in a cross-sectional view,
wherein the second wiring layer is located between the first wiring layer and the lower surface in the cross-sectional view,
wherein the first conductor pattern and the second conductor pattern face each other with an insulating layer interposed therebetween,
wherein an area of a region where the first conductor pattern and the second conductor pattern face each other is larger than an area of the first wire,
wherein the first wire includes a first extending portion extending in a first direction, and a first via land portion connected to the first via wire, and
wherein the first extending portion is located between the first via land portion and the first board terminal in a plan view.

14. An electronic device comprising:
an electronic component including a first terminal from which a first potential is output, and a second terminal from which a second potential different from the first potential is output;
a semiconductor component to which the first potential and the second potential are input;
a first condenser component including a first electrode electrically connected to the first terminal, and a second electrode electrically connected to the second terminal; and
a wiring board on which the electronic component, the semiconductor component, and the first condenser component are mounted,
wherein the wiring board includes:
  a first board terminal connected to the first terminal;
  a first wire formed in a first wiring layer and electrically connected to the first board terminal;
  a first conductor pattern formed in a second wiring layer different from the first wiring layer and electrically connected to the first wire via a first via wire; and
  a second conductor pattern formed in a third wiring layer different from the first wiring layer and the second wiring layer and supplied with a first fixed potential,
wherein the first conductor pattern and the second conductor pattern face each other with an insulating layer interposed therebetween,
wherein an area of a region where the first conductor pattern and the second conductor pattern face each other is larger than an area of the first wire,
wherein the first wire includes a first extending portion extending in a first direction, and a first via land portion connected to the first via wire, and
wherein, in plan view, the first extending portion is located between the first via land portion and the first board terminal, and the first via land portion is located between the first electrode of the first condenser component and the first extending portion of the first wire.

15. The electronic device of claim 14,
wherein the wiring board has an upper surface and a lower surface opposite the upper surface,
wherein the electronic component and the semiconductor component are mounted such that the upper surface faces the electronic component and the semiconductor component,
wherein the first condenser component is mounted such that the lower surface faces the first condenser component,
wherein the first board terminal is formed in the first wiring layer and is electrically connected to the first terminal,
wherein the first wiring layer is located closer to the upper surface than the lower surface in a cross-sectional view, and
wherein the second wiring layer is located between the first wiring layer and the lower surface in the cross-sectional view.

16. The electronic device of claim 14, wherein the first wire electrically connects the semiconductor device to the electronic component, such that said first potential is input to the semiconductor component from the electronic component via the first wire.

17. The electronic device according to claim 1, wherein the first conductor pattern and the second conductor pattern form a capacitor of a noise filter circuit.

18. The electronic device according to claim 1, wherein the first signal is different from the first fixed potential.

19. The electronic device according to claim 1,
  wherein a noise filter circuit is formed by at least the first wire, the first conductor pattern, and the second conductor pattern, and
  the noise filter circuit is configured to reduce noise in said first signal.

20. The electronic device according to claim 1, wherein the second conductor pattern is configured as a shield conductor layer that shields the first conductor pattern from electromagnetic radiation from the first wiring layer.

* * * * *